(12) United States Patent       (10) Patent No.:     US 6,347,062 B2
Nii et al.                       (45) Date of Patent:     Feb. 12, 2002

(54) SEMICONDUCTOR MEMORY DEVICE

(75) Inventors: Koji Nii; Atsushi Miyanishi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/824,008

(22) Filed: Apr. 3, 2001

(30) Foreign Application Priority Data

May 16, 2000 (JP) ........................................ 2000-143861
Jan. 11, 2001 (JP) ........................................ 2001-003500

(51) Int. Cl.[7] ............................................. G11C 11/00
(52) U.S. Cl. ..................... 365/230.05; 365/51; 365/154
(58) Field of Search ........................... 365/230.05, 154, 365/51, 63, 156

(56) References Cited

U.S. PATENT DOCUMENTS

| 5,338,963 A | | 8/1994 | Klassen et al. | 257/376 |
|---|---|---|---|---|
| 5,561,638 A | * | 10/1996 | Gibson et al. | 365/230.05 |
| 5,742,557 A | * | 4/1998 | Gibbins et al. | 365/230.05 |
| 5,886,919 A | * | 3/1999 | Morikawa | 365/51 |
| 6,078,544 A | * | 6/2000 | Park | 365/230.05 |
| 6,288,969 B1 | * | 9/2001 | Gibbins et al. | 365/230.05 |

FOREIGN PATENT DOCUMENTS

| JP | 7-7089 | 1/1995 |
|---|---|---|
| JP | 7-106438 | 4/1995 |
| JP | 9-270468 | 10/1997 |
| JP | 10-178110 | 6/1998 |

* cited by examiner

Primary Examiner—Son T. Dinh
(74) Attorney, Agent, or Firm—Leydig, Voit & Mayer, Ltd.

(57) ABSTRACT

In the construction of a P-well area including a pair of CMOS inverters and a N-well area of a multi-port SRAM cell, the P-well area is divided into two P-well areas. These two P-well areas are disposed on two sides of the N-well area. A layout is provided such that the boundaries between the P-well areas and the N-well area are parallel to bit lines. Two access gates are located in one P-well area and two access gates are located in the other P-well area. Thus, the bit lines can be made shorter, and the amount of wiring can be reduced.

27 Claims, 22 Drawing Sheets

FIG.6
 CONTACT HOLE
 FIRST VIA HOLE
 SECOND VIA HOLE
 CONTACT HOLE PLUS FIRST VIA HOLE

US 6,347,062 B2

1

SEMICONDUCTOR MEMORY DEVICE

FIELD OF THE INVENTION

The present invention relates to a semiconductor memory device. More particularly this invention relates to a layout of a multi-port SRAM (Static Random Access Memory) cell having CMOS construction.

BACKGROUND OF THE INVENTION

In recent years, there has been an increasing demand for a high-speed processing of electronic devices along with a reduction in weigh and sizes of these devices. The mounting of microcomputers on these electronic devices is now unavoidable. It is also essential to install large-capacity and high-speed processing memories on these microcomputers. Further, along with a rapid distribution of high-performance personal computers, there has also been an increasing demand for large-capacity cache memories. In other words, RAMs that are used by the CPU to execute control programs are required to have a large capacity with high-speed processing.

DRAM (Dynamic RAM) and SRAM are generally used as a RAM. Particularly, SRAM is generally used for cache memories and the like that require high-speed processing. The SRAM is known to have a high-resistance load type memory cell and a CMOS type memory cell. The high-resistance load type is constructed of four transistors and two high-resistance elements. The CMOS type is constructed of six transistors. Because of very small leakage current during data holding, the CMOS type SRAM has high reliability and is used as the main kind of SRAM at present.

Generally, a reduction in the area of the memory cell means not only a reduction in the size of the memory cell array but also a realization of high-speed processing. In order to achieve a higher-speed operation of the SRAM than in the past, various layout proposals have been made so far.

For example, according to the semiconductor memory device disclosed in Japanese Patent Application Laid-Open (JP-A) No. 10-178110, P-well areas and N-well area formed with inverters that constitute a memory cell are disposed so that their boundary lines are parallel with bit lines. Based on this arrangement, diffusion areas within the P-well areas and the N-well area and a cross-connected portion of two inverters are formed in simple shapes respectively having no bending. As a result, the cell area is reduced.

FIG. 21 and FIG. 22 are layout diagrams of the semiconductor memory device disclosed in Japanese Patent Application Laid-Open (JP-A) No. 10-178110. FIG. 21 shows diffusion areas formed on the surface of a semiconductor substrate, a polycrystalline silicon film formed on the diffusion areas, and a ground including a first metal-wiring layer. FIG. 22 shows an upper ground including second and third metal-wiring layers formed on the upper layer.

As shown in FIG. 21, in the center of the memory cell, there is disposed the N-well area in which P-channel type MOS transistors P101 and P102 are formed. On both sides of this N-well area, there are formed P-well areas in which N-channel type MOS transistors N101 and N103, and N102 and N104 are formed respectively.

The P-channel type MOS transistors P101 and P102 and the N-channel type MOS transistors N101 and N102 are mutually cross connected to form a CMOS inverter, that is, a flip-flop circuit. The N-channel type MOS transistors N103 and N104 correspond to an access gate (a transfer gate).

As shown in FIG. 22, bit lines BL and /BL are separately formed as second metal-wiring layers. The bit lines BL and

2

/BL are connected to one end of semiconductor terminals of the lower-layer access gate MOS transistors N103 and N104 respectively. A power source line Vdd is formed as a second metal-wiring layer in the center between the bit lines BL and /BL in parallel with these bit lines. The power source line Vdd is connected to one of semiconductor terminals of the lower-layer P-channel type MOS transistors P101 and P102. A word line WL is formed as a third metal-wiring layer in a direction orthogonal with the bit lines BL and /BL. The word line WL is connected to gates of the lower-layer N-channel type MOS transistor N103 and N104. Two ground lines GND are formed as third metal-wiring layers on both sides of the word line WL in parallel with this word line.

As a result of forming the memory cell in this layout, an N-type diffusion area within the P-well area in which the MOS transistors N103 and N103 are located and an N-type diffusion area in which the MOS transistors N102 and N104 are located can be linear and parallel to the bit lines BL and /BL. This construction can prevent occupation of an unnecessary area.

The length of the cell in a lateral direction, that is, the length of the word line WL, is larger than the length of the cell in a longitudinal direction, that is, the length of the bit lines BL and /BL. Therefore, it becomes easy to provide a layout of a sense amplifier connected to the bit lines BL and /BL. At the same time, the number of cells to be connected to one word line can be reduced. As a result, it is possible to reduce a cell current that flows during the reading. In other words, it is possible to reduce power consumption.

The above-described SRAM memory cell is an example of what is called one-port SRAM. In recent years, there has been introduced a multi-processor technique for achieving high-speed processing of computers. Based on this technique, a plurality of CPUs are required to share one memory area. In this aspect, various layouts have been proposed for a multi-port SRAM that makes it possible to have access to CPUs from two ports to the one memory cell.

For example, according to the memory cell disclosed in Japanese Patent Application Laid-Open (JP-A) No. 07-7089, a multi-port SRAM construction is realized by disposing a second port in symmetry with a first port on the same layer and by having the two ports formed at the same time. FIG. 23 shows the layout of the memory cell disclosed in Japanese Patent Application Laid-Open (JP-A) No. 07-7089.

As shown in FIG. 23, P-channel type MOS transistors P201 and P202 and N-channel type MOS transistors N201', N202', N201" and N202" are mutually cross connected to form a CMOS inverter, that is, a flip-flop. N-channel type MOS transistors NA, NB, NA2 and NB2 correspond to access gates (transfer gates).

In other words, N-channel type MOS transistors NA and NB make it possible to have an access from one gate via a word line WL1, and N-channel type MOS transistors NA2 and NB2 make it possible to have an access from the other gate via a word line WL2.

Conventional memory cells have a disadvantage that the amount of wiring of the bit lines is large and a delay increases, as the memory cell has a larger length in the direction of the bit lines. The semiconductor memory device disclosed in Japanese Patent Application Laid-Open (JP-A) No. 10-178110 solves this problem for one-port SRAM.

However, this semiconductor memory device does not solve the above problem for a multi-port SRAM generally having two sets of access gates and a drive-type MOS transistor. The memory cell disclosed in Japanese Patent Application Laid-Open (JP-A) No. 07-7089 shows a layout of a multi-port SRAM cell. However, this provides the layout for making it easy to add a second port without generating a large change in the layout of the one-port SRAM cell. This layout does not reduce the size of the multi-port SRAM cell in the direction of the bit lines.

SUMMARY OF THE INVENTION

It is an object of the present invention to provide a semiconductor memory device having a memory cell with a short length in the direction of bit lines, in the construction of a P-well area formed with a pair of CMOS inverters and a N-well area that constitute a multi-port SRAM cell. In the semiconductor memory device of the present invention, the P-well area is divided into two P-well areas. The two P-well areas are disposed on the two sides of the N-well area. The boundaries between P and N-well areas are parallel to the bit lines, and a pair of access gates are formed in each of the two P-well areas.

In the semiconductor memory device according to one aspect of the present invention, two P-well areas are provided on the two sides of the N-well area, three (first, third and fifth) N-channel type MOS transistors are electrically connected to the positive-phase bit line and are formed in one P-well area, and three (second, fourth and sixth) N-channel type MOS transistors are connected to the negative-phase bit line and are formed in the other P-well area. The P-well areas and the N-well area are disposed in a direction perpendicular to the positive-phase and negative-phase bit lines. Therefore, it is possible to provide a layout that requires shorter bit lines.

Further, the first and second P-well areas are formed on both sides of the N-well area. According, it is possible to make uniform the distances of wiring connection between the N-channel type MOS transistors formed in the first and second P-well areas respectively and the P-channel type MOS transistors formed in the N-well area.

Further, the first positive-phase bit line, first negative-phase bit line, the second positive-phase bit line, and the second negative-phase bit line extend parallel to boundary lines between the first and second P-well areas and the N-well area respectively. According, it is possible to provide a layout having each bit line formed in a shortest length by taking into consideration a reduction in the length of each word line.

Further, the boundary lines between the first and second P-well areas and the N-well area are perpendicular to the direction in which the first and second word lines extend. Accordingly, it is possible to provide a layout having each word line formed in a shortest length by taking into consideration a reduction in the length of each bit line with priority.

Further, the first P-channel type MOS transistor and the first, third and fourth N-channel type MOS transistors are formed so that respective gate areas are parallel with the extension direction of the first word line and are positioned on the same straight line, and the second P-channel type MOS transistor and the second, fifth and sixth N-channel type MOS transistors are formed so that respective gate areas are parallel with the extension direction of the second word line and are positioned on the same straight line. Accordingly, it is possible to form wires for connecting between the gates in a straight-line shape. Further, as the second P-channel type MOS transistor and the gate areas of the second, fifth and sixth N-channel type MOS transistors are positioned on the same straight line, it is possible to form wires for connecting between the gates in a straight-line shape.

Further, the third and fifth N-channel type MOS transistors are formed in such a manner that respective source diffusion areas and drain diffusion areas are positioned on the same straight line, and are also disposed in parallel with the directions of the extension of the first and second positive-phase bit lines. In addition, the fourth and sixth N-channel type MOS transistors are formed in such a manner that respective source diffusion areas and drain diffusion areas are positioned on the same straight line, and are also disposed in parallel with the directions of the extension of the first and second negative-phase bit lines.

Further, drain diffusion areas of the third and fifth N-channel type MOS transistors are formed in a common first $n^+$ diffusion area, and drain diffusion areas of the fourth and sixth N-channel type MOS transistors are formed in a common second $n^+$ diffusion area. Accordingly, it is possible to reduce the size of the $n^+$ diffusion areas.

Further, drain diffusion area of the first N-channel type MOS transistor and drain diffusion areas of the third and fifth N-channel type MOS transistors are connected to each other by an upper-layer first metal-wiring layer via contact holes, and a drain diffusion area of the second N-channel type MOS transistor and drain diffusion areas of the fourth and sixth N-channel type MOS transistors are connected to each other by an upper-layer second metal-wiring layer via contact holes. Accordingly, it is possible to form the first and second metal-wiring layers in a straight-line shape according to the positions of the drain diffusion areas.

Further, the extension direction of the first and second metal-wiring layers is parallel with the extension direction of the first and second word lines. Accordingly, it is possible to optimize the length of the metal-wiring layers like the word lines.

Further, extension directions of the first and second positive-phase bit line, the first and second negative-phase bit lines, the power source line and the GND line respectively are perpendicular to the first and second word lines. Accordingly, it is possible to minimize the respective length of these lines.

Further, drain diffusion areas of the first, third and fifth N-channel type MOS transistors are formed in a common first $n^+$ diffusion area, and drain diffusion areas of the second, fourth and sixth N-channel type MOS transistors are formed in a common second $n^+$ diffusion area. Accordingly, it is possible to omit the metal-wiring layers between these drain diffusion areas.

Further, the first $n^+$ diffusion area and a drain diffusion area of the first P-channel type MOS transistor are connected to each other by an upper-layer first metal-wiring layer via contact holes, and the second $n^+$ diffusion area and a drain diffusion area of the second P-channel type MOS transistor are connected to each other by an upper-layer second metal-wiring layer via contact holes. Accordingly, it is possible to form the metal-wiring layers in a straight-line shape according to the positions of the drain diffusion areas and the $n^+$ diffusion areas.

The semiconductor memory device according to another aspect of the present invention comprises a first word line, a second word line, a first positive-phase bit line, a first negative-phase bit line, and a second positive-phase bit line; a first CMOS inverter that structures a CMOS inverter by including a first N-channel type MOS transistor and a first P-channel type MOS transistor; a second CMOS inverter that structures a CMOS inverter by including a second N-channel type MOS transistor and a second P-channel type MOS transistor, and that has an input terminal of the CMOS inverter connected to an output terminal of the first CMOS inverter as a first memory node, and has an output terminal of the CMOS inverter connected to an input terminal of the first CMOS inverter as a second memory node; a third N-channel type MOS transistor that has a gate connected to the first word line, has a drain connected to the first positive-phase bit line, and has a source connected to the first memory node; a fourth N-channel type MOS transistor that has a gate connected to the first word line, has a drain connected to the first negative-phase bit line, and has a source connected to the second memory node; a fifth N-channel type MOS transistor that has a gate connected to the first memory node; and a sixth N-channel type MOS transistor that has a gate connected to the second word line, has a drain connected to the second positive-phase bit line, and has a source connected to a drain of the fifth N-channel type MOS transistor. In addition, first and second P-channel type MOS transistors are formed in an N-well area, the first and third N-channel type MOS transistors are formed in a first P-well area, and the second, fourth, fifth and sixth N-channel type MOS transistors are formed in a second P-well area.

Further, the semiconductor memory device further comprises a third word line, a first positive-phase line, and a second negative-phase bit line; a seventh N-channel type MOS transistor that has a gate connected to the second memory node; and an eighth N-channel type MOS transistor that has a gate connected to the third word line, has a drain connected to the second negative-phase bit line, and has a source connected to a drain of the seventh N-channel type MOS transistor. The seventh and eighth N-channel type MOS transistors are formed in the first P-well area.

Further, the second and third word lines are formed as one common word line.

Further, the first and second P-well areas are formed at both sides of the N-well area.

Further, the respective directions of the extensions of the first positive-phase bit line, the first negative-phase bit line, and the second positive-phase bit line are parallel with a boundary line between the first and second P-well areas and the N-well area.

Further, a boundary line between the first and second P-well areas and the N-well area is orthogonal with directions of respective extensions of the first and second word lines.

Further, the first P-channel type MOS transistor, and the first, fourth and sixth N-channel type MOS transistors are formed such that their respective gate areas are positioned on the same straight line, and are also disposed in parallel with the direction of the extension of the first word line. Further, the second P-channel type MOS transistor, and the second, third and fifth N-channel type MOS transistors are formed such that their respective gate areas are positioned on the same straight line, and are also disposed in parallel with the direction of the extension of the second word line.

Further, the first and third N-channel type MOS transistors are formed such that a drain diffusion area of the first N-channel type MOS transistor and a source diffusion area of the third N-channel type MOS transistor are positioned on the same straight line, and also disposed in parallel with the direction of the extension of the first positive-phase bit line. Further, the second and fourth N-channel type MOS transistors are formed such that a drain diffusion area of the second N-channel type MOS transistor and a source diffusion area of the fourth N-channel type MOS transistor are positioned on the same straight line, and also disposed in parallel with the direction of the extension of the first negative-phase bit line. Further, the fifth and sixth N-channel type MOS transistors are formed such that a drain diffusion area of the fifth N-channel type MOS transistor and a source diffusion area of the sixth N-channel type MOS transistor are positioned on the same straight line, and also disposed in parallel with the direction of the extension of the second positive-phase bit line.

Further, a drain diffusion area of the first N-channel type MOS transistor and a source diffusion area of the third N-channel type MOS transistor are formed in a common first $n^+$ diffusion area. Further, a drain diffusion area of the second N-channel type MOS transistor and a source diffusion area of the fourth N-channel type MOS transistor are formed in a common second $n^+$ diffusion area. Further, a drain diffusion area of the fifth N-channel type MOS transistor and a source diffusion area of the sixth N-channel type MOS transistor are formed in a common third $n^+$ diffusion area.

Further, the second P-channel type MOS transistor, and the second and fifth N-channel type MOS transistors have their respective gate areas connected by a straight line-shaped common polysilicon wiring.

Further, the directions of the extensions of the first and second positive-phase bit lines, the first negative-phase bit line, a power source line, and a GND line respectively are perpendicular to the first and second word lines.

Further, the first P-channel type MOS transistor, and the first, fourth, sixth and seventh N-channel type MOS transistors are formed such that their respective gate areas are in parallel with the direction of the extension of the first word line, and are also positioned on the same straight line. Further, the second P-channel type MOS transistor, and the second, third, fifth and eighth N-channel type MOS transistors are formed such that their respective gate areas are in parallel with the direction of the extension of the second word line, and are also positioned on the same straight line.

Further, the first and third N-channel type MOS transistors are formed such that a drain diffusion area of the first N-channel type MOS transistor and a source diffusion area of the third N-channel type MOS transistor are in parallel with the direction of the extension of the first positive-phase bit line, and are also positioned on the same straight line. Further, the second and fourth N-channel type MOS transistors are formed such that a drain diffusion area of the second N-channel type MOS transistor and a source diffusion area of the fourth N-channel type MOS transistor are in parallel with the direction of the extension of the first negative-phase bit line, and are also positioned on the same straight line. Further, the fifth and sixth N-channel type MOS transistors are formed such that a drain diffusion area of the fifth N-channel type MOS transistor and a source diffusion area of the sixth N-channel type MOS transistor are in parallel with the direction of the extension of the second positive-phase bit line, and are also positioned on the same straight line. Further, the seventh and eighth N-channel type MOS transistors are formed such that a drain diffusion area of the seventh N-channel type MOS transistor and a source diffusion area of the eighth N-channel type MOS transistor are in parallel with the direction of the extension of the second negative-phase bit line, and are also positioned on the same straight line.

Further, a drain diffusion area of the first N-channel type MOS transistor and a source diffusion area of the third N-channel type MOS transistor are formed in a common first $n^+$ diffusion area. Further, a drain diffusion area of the second N-channel type MOS transistor and a source diffusion area of the fourth N-channel type MOS transistor are formed in a common second n+ diffusion area. Further, a drain diffusion area of the fifth N-channel type MOS transistor and a source diffusion area of the sixth N-channel type MOS transistor are formed in a common third n+ diffusion area. Further, a drain diffusion area of the seventh N-channel type MOS transistor and a source diffusion area of the eighth N-channel type MOS transistor are formed in a common fourth n+ diffusion area.

Further, the second P-channel type MOS transistor, and the second and fifth N-channel type MOS transistors have their respective gate areas connected by a straight line-shaped common first polysilicon wiring. Further, the first P-channel type MOS transistor, and the first and seventh N-channel type MOS transistors have their respective gate areas connected by a straight line-shaped common second polysilicon wiring.

Other objects and features of this invention will become apparent from the following description with reference to the accompanying drawings.

BRIEF DESCRIPTION OF THE DRAWINGS

FIG. 6 is an explanation of various symbols like a contact hole, a via hole, etc.

DESCRIPTION OF THE PREFERRED EMBODIMENTS

Preferred embodiments of the present invention will be explained below with reference to the accompanying drawings. The following embodiments will not limit the present invention.

Figure 1:
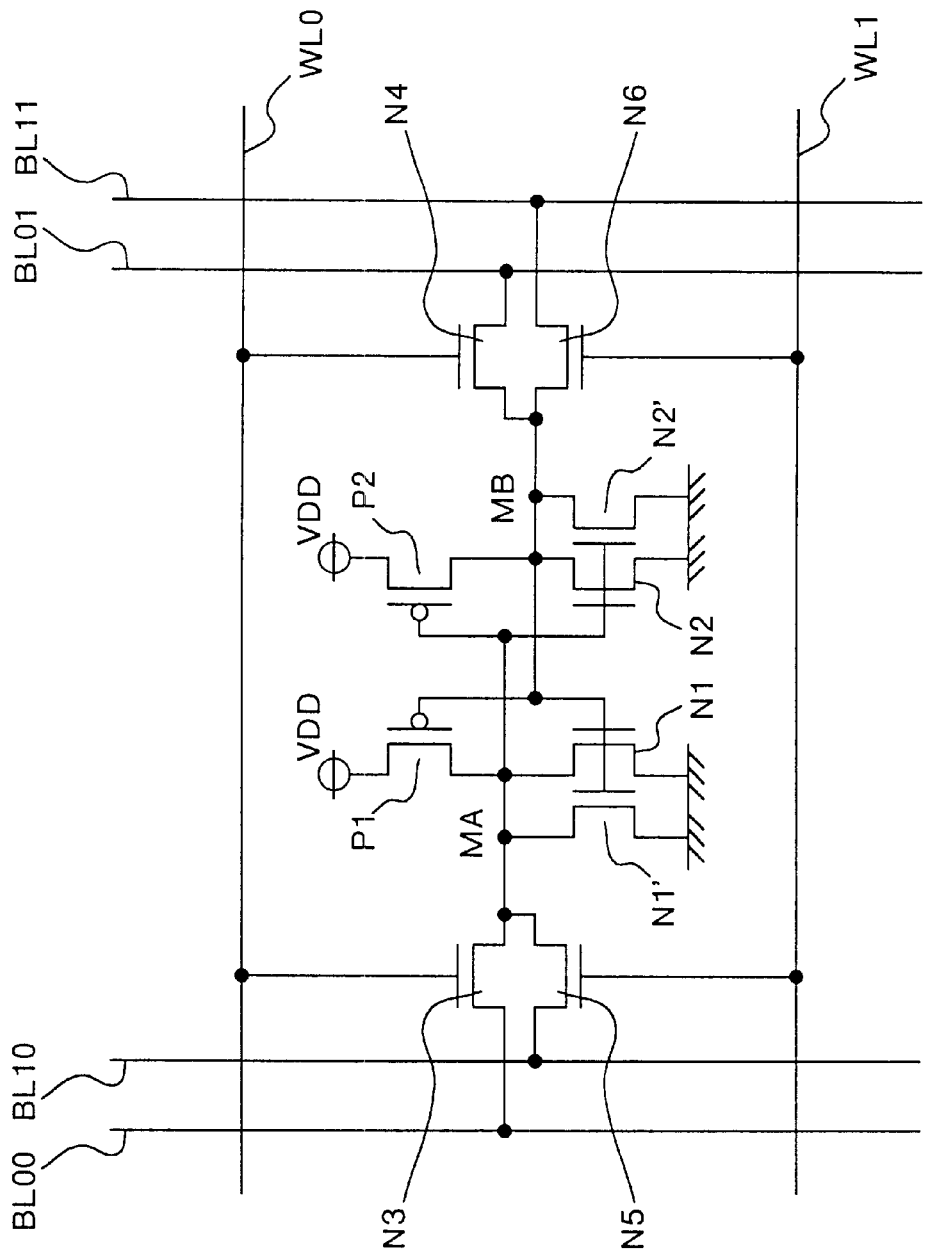
FIG. 1 is a diagram showing an equivalent circuit of a semiconductor memory device according to a first embodiment of the present invention.

A semiconductor memory device of a first embodiment will be explained here. FIG. 1 shows an equivalent circuit of the semiconductor memory device of the first embodiment. A P-channel type MOS transistor P1 and an N-channel type MOS transistor N1 (N1') constitute a first CMOS inverter. A P-channel type MOS transistor P2 and an N-channel type MOS transistor N2 (N2') constitute a second CMOS inverter. Inputs and outputs of these CMOS inverters are connected in cross.

In other words, these MOS transistors P1, P2, N1, N1', N2 and N2' constitute a flip-flop circuit. In FIG. 1, it is possible to carry out a writing and a reading in a logic state in a memory node MA which is an output point of the first CMOS inverter and input point of the second CMOS inverter, and in a memory node MB which is an output point of the second CMOS inverter and input point of the first CMOS inverter.

N-channel type MOS transistors M3, N4, N5 and N6 function as access gates respectively. The gate of the N-channel type MOS transistor N3 is connected to a first word line WL0, the source is connected to the memory node MA, and the drain is connected to a first positive-phase bit line BL00. The gate of the N-channel type MOS transistor N5 is connected to a second word line WL1, the source is connected to the memory node MA, and the drain is connected to a second positive-phase bit line BL10.

The gate of the N-channel type MOS transistor N4 is connected to a first word line WL0, the source is connected to the memory node MB, and the drain is connected to a first negative-phase bit line BL01. The gate of the N-channel type MOS transistor N6 is connected to the second word line WL1, the source is connected to the memory node MB, and the drain is connected to a second negative-phase bit line BL11.

In other words, it is possible to read a memory value of a first port by selecting the first word line WL0, the first positive-phase bit line BL00 and the first negative-phase bit line BL01. It is possible to read a memory value of a second port by selecting the second word line WL1, the second positive-phase bit line BL10 and the second negative-phase bit line BL11.

Figure 2:
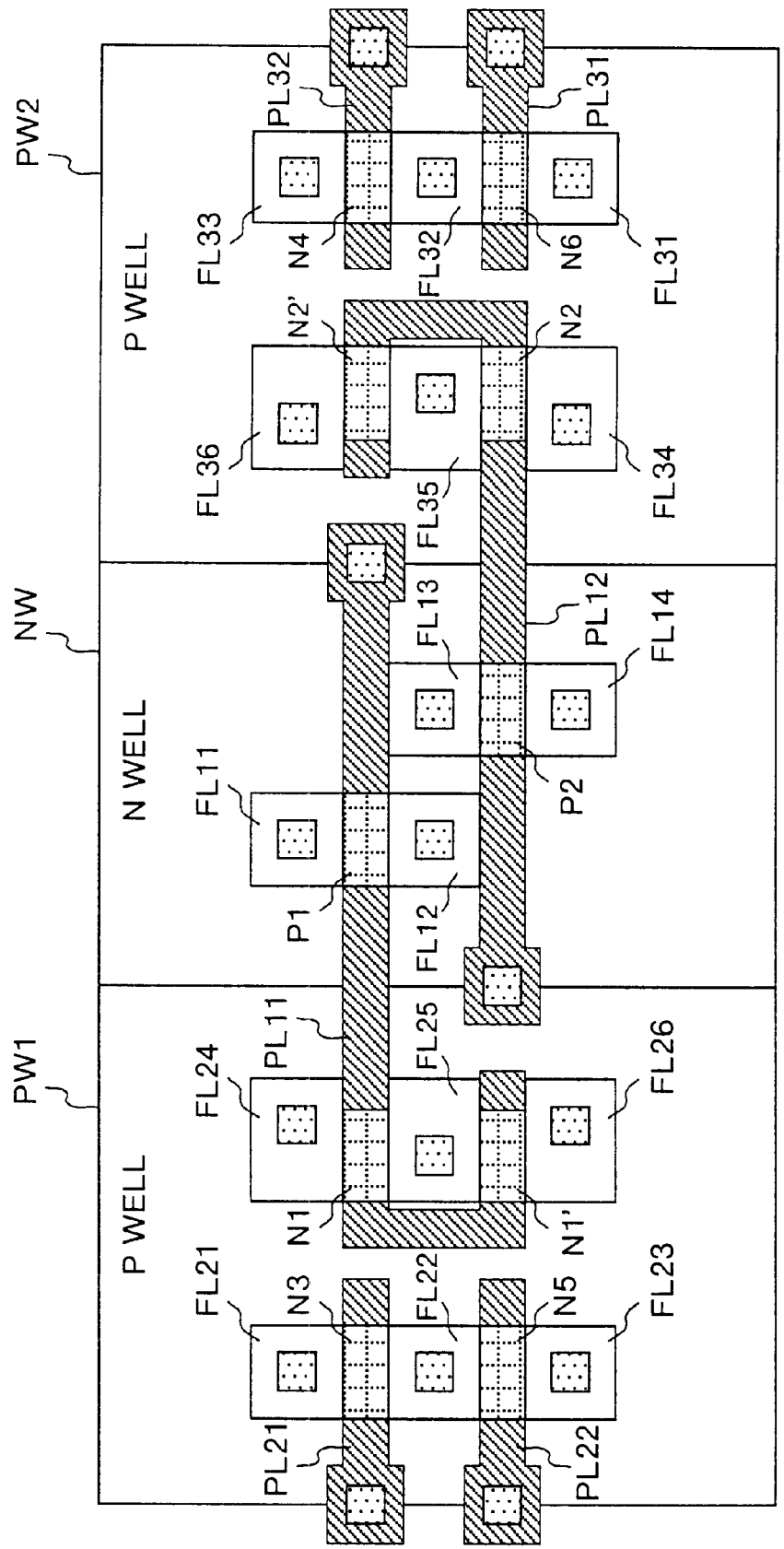
FIG. 2 is a diagram showing an example of the layout of a memory cell of the semiconductor memory device according to the first embodiment.

The equivalent circuit itself shown in FIG. 1 is not different from the circuit of the conventional two-port SRAM cell. However, in the semiconductor memory device of the first embodiment, there is a characteristic in the construction of the memory cell. FIG. 2 to FIG. 5 are layout diagrams of the memory cell of the semiconductor memory device of the first embodiment. FIG. 6 explains various symbols like a contact hole, a via hole, etc. shown in FIG. 2 to FIG. 5. FIG. 2 shows layers including well areas formed on a semiconductor substrate, diffusion areas formed in the well areas, and a polysilicon wiring layer formed on the upper surface.

In the memory cell of the semiconductor memory device of the first embodiment, there are formed a first P-well area PW1, an N-well area NW, and a second P-well area PW2 in this sequence in a plain direction on the semiconductor substrate, as shown in FIG. 2. In other words, the two P-well areas PW1 and PW2 are disposed separately on the two sides of the N-well area NW.

Particularly, these well areas are formed so that a boundary line between the first P-well area PW1 and the N-well area NW (hereinafter to be referred to as a first well boundary line) and a boundary line between the second P-well area PW2 and the N-well area NW (hereinafter to be referred to as a second well boundary line) are parallel with each other. Although not shown in FIG. 2, there exist a separation area between the N-well area NW and the first P-well area PW1 and between the N-well area NW and the second P-well area PW2 respectively.

The N-channel type MOS transistors N1, N1', N3 and N5 shown in FIG. 1 are formed in the first P-well area PW1. The P-channel type MOS transistors P1 and P2 shown in FIG. 1 are formed in the N-well area NW. Further, the N-channel type MOS transistors N2, N2', N4 and N6 shown in FIG. 1 are formed in the second P-well area PW2.

The construction of each layer shown in FIG. 2 to FIG. 5 will be explained in sequence. First, in the layers shown in FIG. 2, two polysilicon wiring layers PL21 and PL22 are disposed in the first P-well area PW1 extending in a direction perpendicular to the first well boundary line. Similarly, two polysilicon wiring layers PL31 and PL32 are disposed in the second P-well area PW2 extending in a direction perpendicular to the second well boundary line.

A piece type polysilicon wiring layer PL11 is formed in the area from the N-well area NW to the first P-well area PW1 in a direction perpendicular to the first well boundary line so that the piece end is positioned in the first P-well area PW1. As shown in FIG. 2, the piece end has a shape that two parallel axes (a main axis and a return axis) that constitute the piece end of the polysilicon wiring layer PL11 coincide with axes of the two polysilicon wiring layers PL21 and PL22 respectively. Further, the main axis of the polysilicon wiring layer PL11 coincides with the polysilicon wiring layer PL21. On the other hand, the other end of the polysilicon wiring layer PL11 is positioned on the second well boundary line.

Similarly, a piece type polysilicon wiring layer PL12 is formed in the area from the N-well area NW to the second P-well area PW2 in a direction perpendicular to the second well boundary line so that the piece end is positioned in the second P-well area PW2. As shown in FIG. 2, the piece end has a shape that two parallel axes that constitute the piece end of the polysilicon wiring layer PL12 coincide with axes of the two polysilicon wiring layers PL31 and PL32 respectively. Further, the main axis of the polysilicon wiring layer PL12 coincides with the polysilicon wiring layer PL31. On the other hand, the other end of the polysilicon wiring layer PL12 is positioned on the first well boundary line.

$n^+$ diffusion areas FL21 and FL22 are formed in the first P-well area PW1 by injecting an N-type impurity at positions sandwiching the polysilicon wiring layer PL21. Thus, there is formed an N-channel type MOS transistor N3 that uses the polysilicon wiring layer PL21 as a gate electrode. Further, $n^+$ diffusion areas FL22 and FL23 are formed at positions sandwiching the polysilicon wiring layer PL22. Thus, there is formed an N-channel type MOS transistor N5 that uses the polysilicon wiring layer PL22 as a gate electrode.

Particularly, as the polysilicon wiring layers PL21 and PL22 are disposed in parallel in the N-channel type MOS transistors N3 and N5 respectively, it is possible to dispose the $n^+$ diffusion areas FL21 to FL23 in a direction parallel with the first well boundary line and also in a straight line. With this arrangement, the N-channel type MOS transistors N3 and N5 can share the $n^+$ diffusion area FL22. The sharing of this $n^+$ diffusion area FL22 makes it possible to connect the sources of the N-channel type MOS transistors N3 and N5 together, and also contributes to reduce the area occupied by the N-channel type MOS transistors N3 and N5, according to the equivalent circuit shown in FIG. 1.

Further, $n^+$ diffusion areas FL24 and FL25 are formed in the first P-well area PW1 by injecting an N-type impurity at positions sandwiching the main axis of the piece end of the polysilicon wiring layer PL11. Thus, there is formed an N-channel type MOS transistor N1 that uses the main axis of the polysilicon wiring layer PL11 as a gate electrode. Further, $n^+$ diffusion areas FL25 and FL26 are formed at positions sandwiching the return axis of the piece end of the polysilicon wiring layer PL11. Thus, there is formed an N-channel type MOS transistor N1' that uses the return axis of the polysilicon wiring layer PL11 as a gate electrode. In other words, the piece end of the polysilicon wiring layer PL11 makes it possible to connect the gates of the N-channel type MOS transistors N1 and N1' together, according to the equivalent circuit shown in FIG. 1.

Similarly, like the N-channel type MOS transistors N3 and N5, the main axis and the return axis of the polysilicon wiring layer PL11 are disposed in parallel in the N-channel type MOS transistors N1 and N1' respectively. Therefore, it is possible to dispose the $n^+$ diffusion areas FL24 to FL26 in a direction parallel with the first well boundary line and also in a straight line. With this arrangement, the N-channel type MOS transistors N1 and N1' can share the $n^+$ diffusion area FL25. The sharing of this $n^+$ diffusion area FL25 makes it possible to connect the drains of the N-channel type MOS transistors N1 and N1' together, and also contributes to reduce the area occupied by the N-channel type MOS transistors N1 and N1', according to the equivalent circuit shown in FIG. 1.

Further, as shown in FIG. 2, the main axes of the polysilicon wiring layer PL21 and the polysilicon wiring layer PL11 are positioned on the same straight line, and the return axes of the polysilicon wiring layer PL22 and the polysilicon wiring layer PL11 are also positioned on the same straight line. Therefore, it is possible to reduce the disposition distance between the N-channel type MOS transistors N1 and N1' and between the N-channel type MOS transistors N3 and N5 respectively. As a result, it is possible to achieve a reduction in the area occupied by these four N-channel type MOS transistors in the first P-well area PW1.

$n^+$ diffusion areas FL31 and FL32 are similarly formed in the second P-well area PW2 by injecting an N-type impurity at positions sandwiching the polysilicon wiring layer PL31. Thus, there is formed an N-channel type MOS transistor N6 that uses the polysilicon wiring layer PL21 as a gate electrode. Further, $n^+$ diffusion areas FL32 and FL33 are formed at positions sandwiching the polysilicon wiring layer PL32. Thus, there is formed an N-channel type MOS transistor N4 that uses the polysilicon wiring layer PL32 as a gate electrode.

As the polysilicon wiring layers PL31 and PL32 are also disposed in parallel in the N-channel type MOS transistors N4 and N6 respectively, it is possible to dispose the $n^+$ diffusion areas FL31 to FL33 in a direction parallel with the second well boundary line and also in a straight line. With this arrangement, the N-channel type MOS transistors N4 and N6 can share the $n^+$ diffusion area FL32. The sharing of this $n^+$ diffusion area FL32 makes it possible to connect the sources of the N-channel type MOS transistors N4 and N6 together, and also contributes to reduce the area occupied by the N-channel type MOS transistors N4 and N6, according to the equivalent circuit shown in FIG. 1.

$n^+$ diffusion areas FL34 and FL35 are formed in the second P-well area PW2 by injecting an N-type impurity at positions sandwiching the main axis of the piece end of the polysilicon wiring layer PL12. Thus, there is formed an N-channel type MOS transistor N2 that uses the main axis of the polysilicon wiring layer PL12 as a gate electrode. Further, $n^+$ diffusion areas FL35 and FL36 are formed at positions sandwiching the return axis of the piece end of the polysilicon wiring layer PL12. Thus, there is formed an N-channel type MOS transistor N2' that uses the return axis of the polysilicon wiring layer PL12 as a gate electrode. In other words, the piece end of the polysilicon wiring layer PL12 makes it possible to connect the gates of the N-channel type MOS transistors N2 and N2' together, according to the equivalent circuit shown in FIG.

Similarly, like the N-channel type MOS transistors N4 and N6, the main axis and the return axis of the polysilicon wiring layer PL12 are disposed in parallel in the N-channel type MOS transistors N2 and N2' respectively. Therefore, it is possible to dispose the $n^+$ diffusion areas FL34 to FL36 in a direction parallel with the second well boundary line and also in a straight line. With this arrangement, the N-channel type MOS transistors N2 and N2' can share the $n^+$ diffusion area FL35. The sharing of this $n^+$ diffusion area FL35 makes it possible to connect the drains of the N-channel type MOS transistors N2 and N2' together, and also contributes to reduce the area occupied by the N-channel type MOS transistors N2 and N2', according to the equivalent circuit shown in FIG. 1.

Further, as shown in FIG. 2, the main axes of the polysilicon wiring layer PL31 and the polysilicon wiring layer PL12 are positioned on the same straight line, and the return axes of the polysilicon wiring layer PL32 and the polysilicon wiring layer PL12 are also positioned on the same straight line. Therefore, it is possible to reduce the disposition distance between the N-channel type MOS transistors N2 and N2' and between the N-channel type MOS transistors N4 and N6 respectively. As a result, it is possible to achieve a reduction in the area occupied by these four N-channel type MOS transistors in the second P-well area PW2.

$p^+$ diffusion areas FL11 and FL12 are formed in the N-well area NW by injecting a P-type impurity at positions sandwiching the main axis of the polysilicon wiring layer PL11. Thus, there is formed a P-channel type MOS transistor PI that uses the polysilicon wiring layer PL11 as a gate electrode. Further, $p^+$ diffusion areas FL13 and FL14 are formed at positions sandwiching the main axis of the polysilicon wiring layer PL12. Thus, there is formed a P-channel type MOS transistor P2 that uses the polysilicon wiring layer PL12 as a gate electrode.

Positions of the P-channel type MOS transistors P1 and P2 are determined based on the positions of the polysilicon wiring layers PL11 and PL12. Distance between the polysilicon wiring layers PL11 and PL12 can be reduced to about the size of the $p^+$ diffusion area FL12 or the FL13 (minimum pitch of the transistor) as shown in FIG. 2. Particularly, when the sizes of the $p^+$ diffusion areas FL12 and FL13 are set approximately equal to the sizes of the $n^+$ diffusion areas FL22 and FL25 in the first P-well area PW1 and the $n^+$ diffusion areas FL32 and FL35 in the second P-well area PW2, it is possible to minimize the total area required for the layout of the memory cell.

The above arrangement also means that it is possible to dispose the main axes of the polysilicon wiring layers PL21 and PL11, the return axis of the PL12 and the PL32 on the same straight line, and it is also possible to dispose the main axes of the polysilicon wiring layers PL22 and PL12, the return axis of the PL11 and the PL31 on the same straight line.

In order to have an electrical connection with the upper layer, there is one contact hole provided on each of the polysilicon wiring layers PL11, PL12, PL21, PL22, PL31 and PL32, the $p^+$ diffusion areas FL11 to FL14, and the $n^+$ diffusion areas FL21 to FL26 and FL31 to FL36 as shown in FIG. 2.

Figure 3:
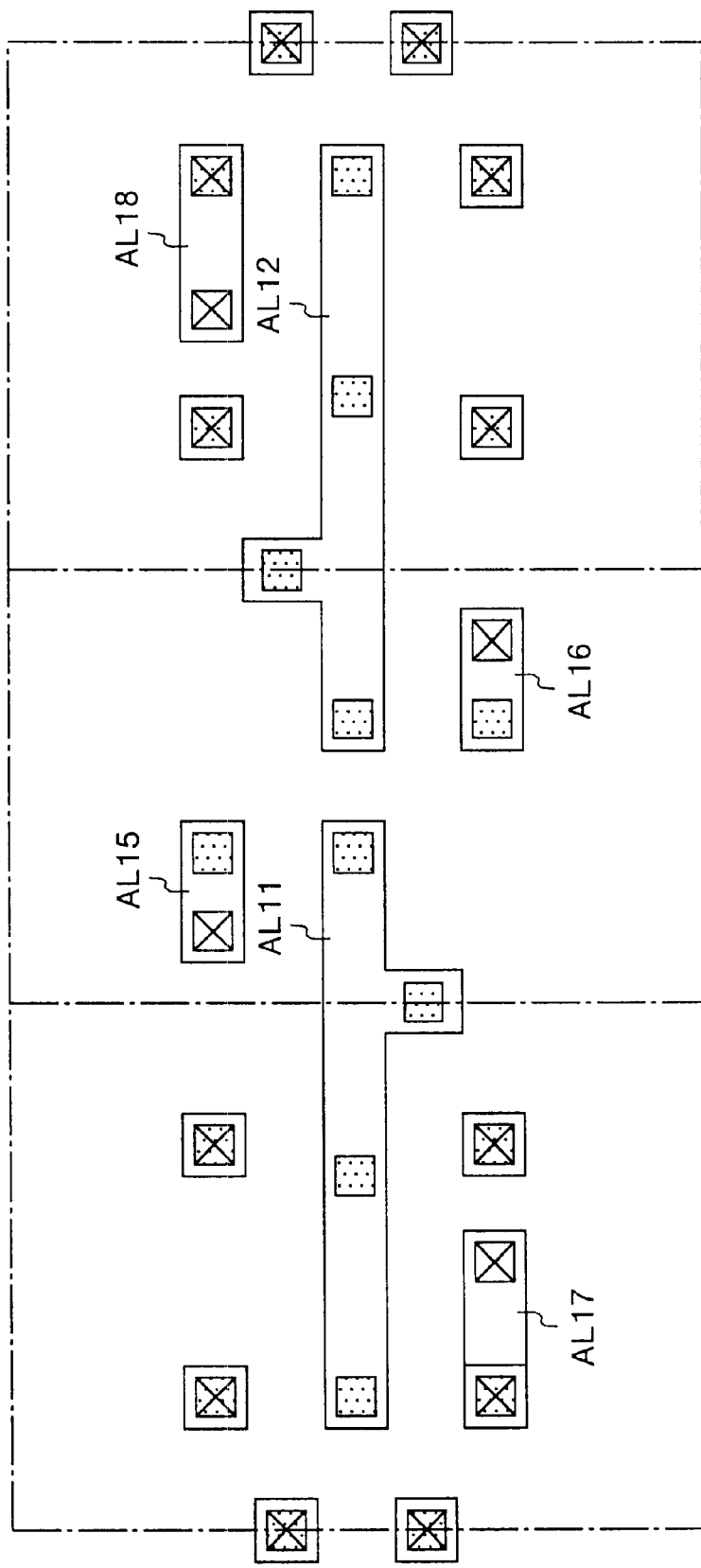
FIG. 3 is a diagram showing an another example of the layout of the memory cell of the semiconductor memory device according to the first embodiment.

Next, layers positioned above the layers shown in FIG. 2 will be explained. FIG. 3 shows layers including first metal-wiring layers formed on the layers shown in FIG. 2. As one of layers shown in FIG. 3, there is formed a first metal-wiring layer AL11 for electrically connecting the lower-layer items of the $n^+$ diffusion areas FL22 and FL25, the $p^+$ diffusion area FL12, and the polysilicon wiring layer PL12. This first metal-wiring layer AL11 makes it possible to connect the sources of the N-channel type MOS transistors N3 and N5, the drains of the N-channel type MOS transistors N1 and N1', the output terminal of the first CMOS inverter, and the input terminal of the second CMOS inverter, according to the equivalent circuit shown in FIG. 1.

Further, there is formed a first metal-wiring layer AL12 for electrically connecting between the lower-layer items of the $n^+$ diffusion areas FL32 and FL35, the $p^+$ diffusion area FL13, and the polysilicon wiring layer PL11. This first metal-wiring layer AL12 makes it possible to connect between the sources of the N-channel type MOS transistors N4 and N6, the drains of the N-channel type MOS transistors N2 and N2, the output terminal of the second CMOS inverter, and the input terminal of the first CMOS inverter, according to the equivalent circuit shown in FIG. 1.

Particularly, in the first metal-wiring layer AL11, the contact points of the $n^+$ diffusion areas FL32 and FL35 and the p⁺ diffusion area FL13 are disposed on the same straight line as described above. Therefore, it is possible to form a wire for connecting between these three points in a straight-line shape. The above similarly applies to the first metal-wiring layer AL12.

Further, as layers shown in FIG. 3, there are formed a first metal-wiring layer AL15 for moving the connection point of the lower-layer p⁺ diffusion area FL11, and a first metal-wiring layer AL16 for moving the connection point of the lower-layer p⁺ diffusion area FL14. There are also formed a first metal-wiring layer AL17 for moving the connection point of the lower-layer n⁺ diffusion area FL23, and a first metal-wiring layer AL18 for moving the connection point of the lower-layer n⁺ diffusion area FL33.

Figure 4:
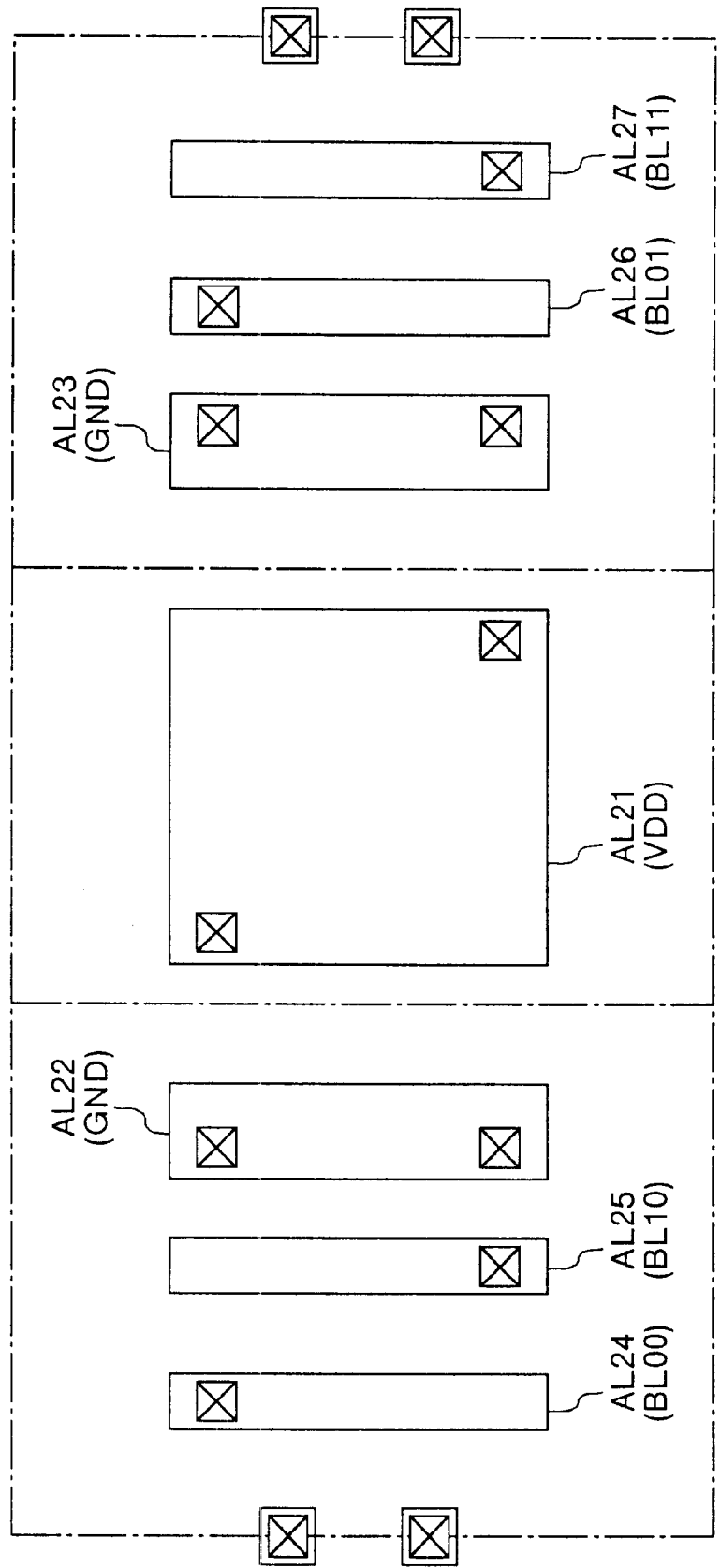
FIG. 4 is a diagram showing still another example of the layout of the memory cell of the semiconductor memory device according to the first embodiment.

Next, layers positioned above the layers shown in FIG. 3 will be explained. FIG. 4 shows layers including second metal-wiring layers formed on the layers shown in FIG. 3. As one of layers shown in FIG. 4, there is formed a second metal-wiring layer AL21 for applying a power source potential VDD to the p⁺ diffusion area FL11 via the first metal-wiring layer AL15 shown in FIG. 3 and for applying a power source potential VDD to the p⁺ diffusion area FL14 via the first metal-wiring layer AL16. In other words, the second metal-wiring layer AL21 functions as a power source potential VDD line, and achieves a connection between the source of the P-channel type MOS transistor P1 and the power source and a connection between the source of the P-channel type MOS transistor P2 and the power source, in the equivalent circuit shown in FIG. 1.

Further, there are formed second metal-wiring layers AL22 and AL23 for applying a ground potential GND to the p⁺ diffusion areas FL24 and FL26 and to the p⁺ diffusion areas FL34 and FL36 respectively via contact holes and first via holes shown in FIG. 3. In other words, the second metal-wiring layers AL22 and AL23 function as a ground potential GND line respectively, and achieve a grounding of each source of the N-channel type MOS transistors N1, N1', N2 and N2' respectively, in the equivalent circuit shown in FIG. 1.

Particularly, as shown in FIG. 2, the n⁺ diffusion areas FL24 and FL26 are disposed on a straight line parallel with the first well boundary line. Therefore, the contact holes on the n⁺ diffusion areas may be formed at positions where a straight line connecting between the contact holes is parallel with the first well boundary line. In other words, it is possible to form the second metal-wiring layer AL22 shown in FIG. 4 in a straight-line shape parallel with the first well boundary line. This similarly applies to the second metal-wiring layer AL23.

Further, as layers shown in FIG. 4, there are formed a second metal-wiring layer AL24 that is connected with the lower-layer p⁺ diffusion area FL21 and functions as a first positive-phase bit line BL00, a second metal-wiring layer AL25 that is connected with the lower-layer p⁺ diffusion area FL26 and functions as a second positive-phase bit line BL10, a second metal-wiring layer AL26 that is connected with the lower-layer p⁺ diffusion area FL36 and functions as a first negative-phase bit line BL01, and a second metal-wiring layer AL27 that is connected with the lower-layer p⁺ diffusion area FL31 and functions as a second negative-phase bit line BL11, via the contact holes and the first via holes shown in FIG. 3 respectively.

In other words, these second metal-wiring layers AL24 to AL27 achieve a connection between the other semiconductor end (drain) of the N-channel type MOS transistor N3 and the first positive-phase bit line BL00, a connection between the other semiconductor end (drain) of the N-channel type MOS transistor N5 and the second positive-phase bit line BL10, a connection between the other semiconductor end (drain) of the N-channel type MOS transistor N4 and the first negative-phase bit line BL01, and a connection between the other semiconductor end (drain) of the N-channel type MOS transistor N6 and the second negative-phase bit line BL11, respectively, in the equivalent circuit shown in FIG. 1.

Particularly, it is possible to form the second metal-wiring layers AL24 to AL27 in a straight-line shape respectively extending in a direction parallel with the first well boundary line. This means that it is possible to further reduce the length of each of the first positive-phase bit line BL00, the second positive-phase bit line BL10, the first negative-phase bit line BL01 and the second negative-phase bit line BL11, within one memory cell.

Figure 5:
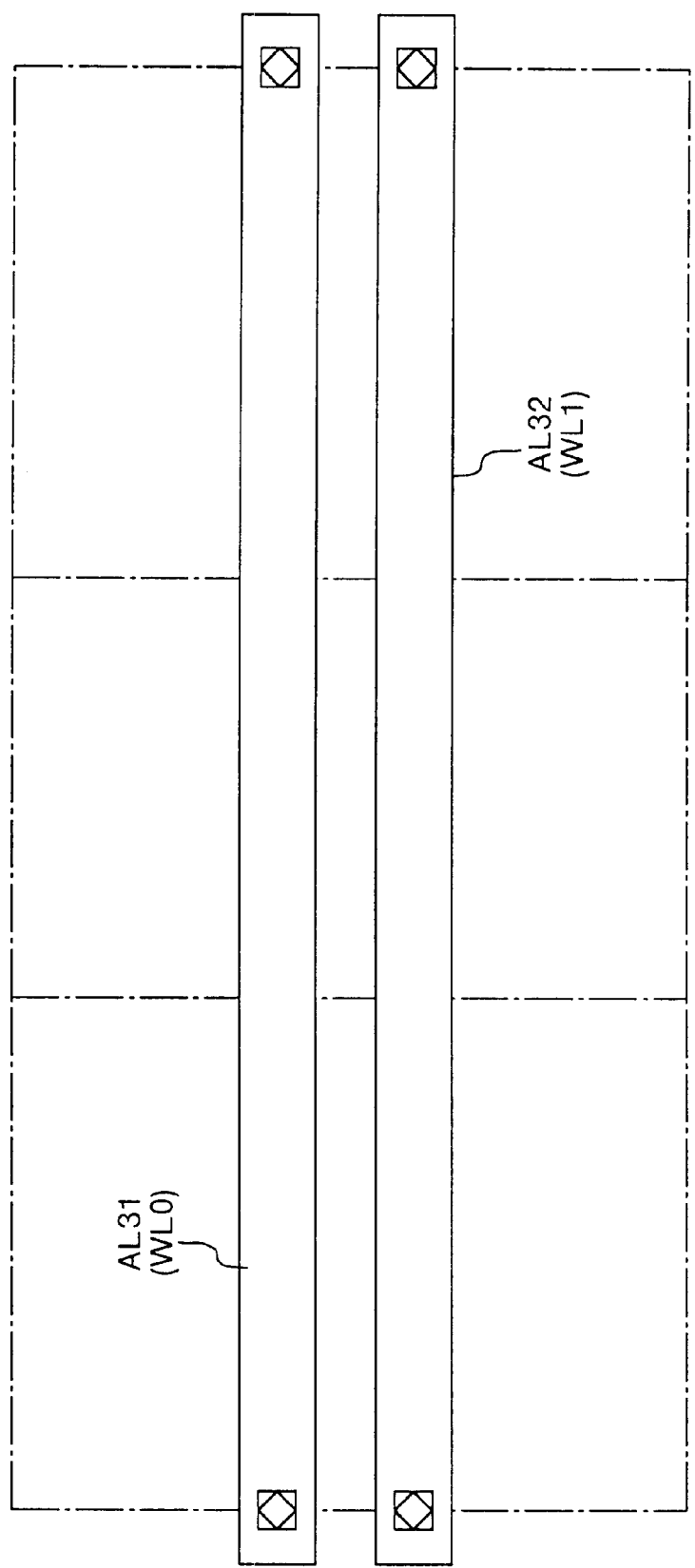
FIG. 5 is a diagram showing still another example of the layout of the memory cell of the semiconductor memory device according to the first embodiment.

Next, layers positioned above the layers shown in FIG. 4 will be explained. FIG. 5 shows layers including third metal-wiring layers formed on the layers shown in FIG. 4. As one of layers shown in FIG. 5, there is formed a third metal-wiring layer AL31 for electrically connecting the polysilicon wiring layers PL21 and PL32 via the first via hole and a second via hole and for functioning as a first word line WL0. In other words, the third metal-wiring layer AL31 achieves a connection between the gates of the N-channel type MOS transistors N3 and N4 and the first word line WL0, in the equivalent circuit shown in FIG. 1.

Further, there is formed a third metal-wiring layer AL32 for electrically connecting the polysilicon wiring layers PL22 and PL31 via the first via hole and the second via hole and for functioning as a second word line WL1. In other words, the third metal-wiring layer AL32 achieves a connection between the gates of the N-channel type MOS transistors N5 and N6 and the second word line WL1, in the equivalent circuit shown in FIG. 1.

Particularly, as shown in FIG. 2, the polysilicon wiring layers PL21 and PL32 are disposed on the same straight line extending in a direction perpendicular to the first well boundary line. Therefore, it is possible to form the contact holes on the polysilicon wiring layers at positions where a straight line connecting between these contact holes is perpendicular to the first well boundary line. In other words, the third metal-wiring layer AL31 shown in FIG. 5 can be formed in a straight-line shape extending in a direction perpendicular to the first well boundary line. This similarly applies to the third metal-wiring layer AL32. This means that it is possible to further reduce the length of each of the first word line WL0 and the second word line WL1 within one memory cell.

As explained above, according to the semiconductor memory device of the first embodiment, the N-channel type MOS transistors N3 and N5 (or N4 and N6) functioning as access gates share the common n⁺ diffusion area FL22 (or FL32) at a connection point between these semiconductors. Similarly, the n⁺ diffusion areas FL21 to FL23 (or FL31 to FL33) that become the respective semiconductor terminals are formed on the same straight line parallel with the first well boundary line. Therefore, it is possible to reduce the area occupied by the N-channel type MOS transistors N3 and N5 (or N4 and N6). This makes it possible to increase the integration degree of the memory cell array.

Further, the second metal-wiring layers AL24 to AL27 that function as the first positive-phase bit line BL00, the second positive-phase bit line BL10, the first negative-phase bit line BL01 and the second negative-phase bit line BL11 in this order respectively are formed in parallel with the boundary lines between the first P-well area PW1, the second P-well area PW2 and the N-well area NW respectively. Therefore, each bit line length can be reduced. As a result, it is possible to reduce the amount of wiring of the bit lines, which makes it possible to achieve a high-speed accessing.

Further, the third metal-wiring layers AL31 and AL32 that function as the first word line WL0 and the second word line WL1 respectively are formed so that these layers are orthogonal with the boundary lines between the first P-well area PW1 and the second P-well area PW2 and the N-well area NW respectively. Therefore, each word line length can be reduced. As a result, it is possible to reduce the amount of wiring of the word lines, which makes it possible to achieve a high-speed accessing.

Further, as the N-channel type MOS transistors N1 and N2 (or N1' and N2') are provided in the two different P-well areas, it is possible to take a large width for each transistor. As a result, extraction of bit lines becomes faster, which makes it possible to achieve an access at a higher speed.

Further, as the N-channel type MOS transistors N1 and N1' (or N2 and N2') that function as driver transistors are formed in parallel, it is possible to take a large width W for each transistor. As a result, extraction of bit lines becomes faster, which makes it possible to achieve a reading access at a higher speed.

Further, based on the above-described division (providing indifferent areas) of the N-channel type MOS transistors, it is possible to take a large transistor ratio for the N-channel type MOS transistors N3 and N5 that function as access gates and for the N-channel type MOS transistors N1 and N1' that function as driver transistors respectively. Therefore, it is possible to improve the stability of the cell. This similarly applies to the N-channel type MOS transistors N4 and N6 and the N-channel type MOS transistors N2 and N2' respectively.

Further, as the drain areas for forming the memory nodes MA and MB are made in a common $n^+$ diffusion area, it is possible to reduce the size of these areas. As a result, a parasitic capacitance can be reduced, which makes it possible to achieve a writing access at a higher speed.

Further, the drain areas for forming the memory nodes MA and MB are made in a common $n^+$ diffusion area. Therefore, it is possible to reduce the size of these areas. As a result, a parasitic capacitance can be reduced, which makes it possible to achieve a writing access at a higher speed.

Figure 7:
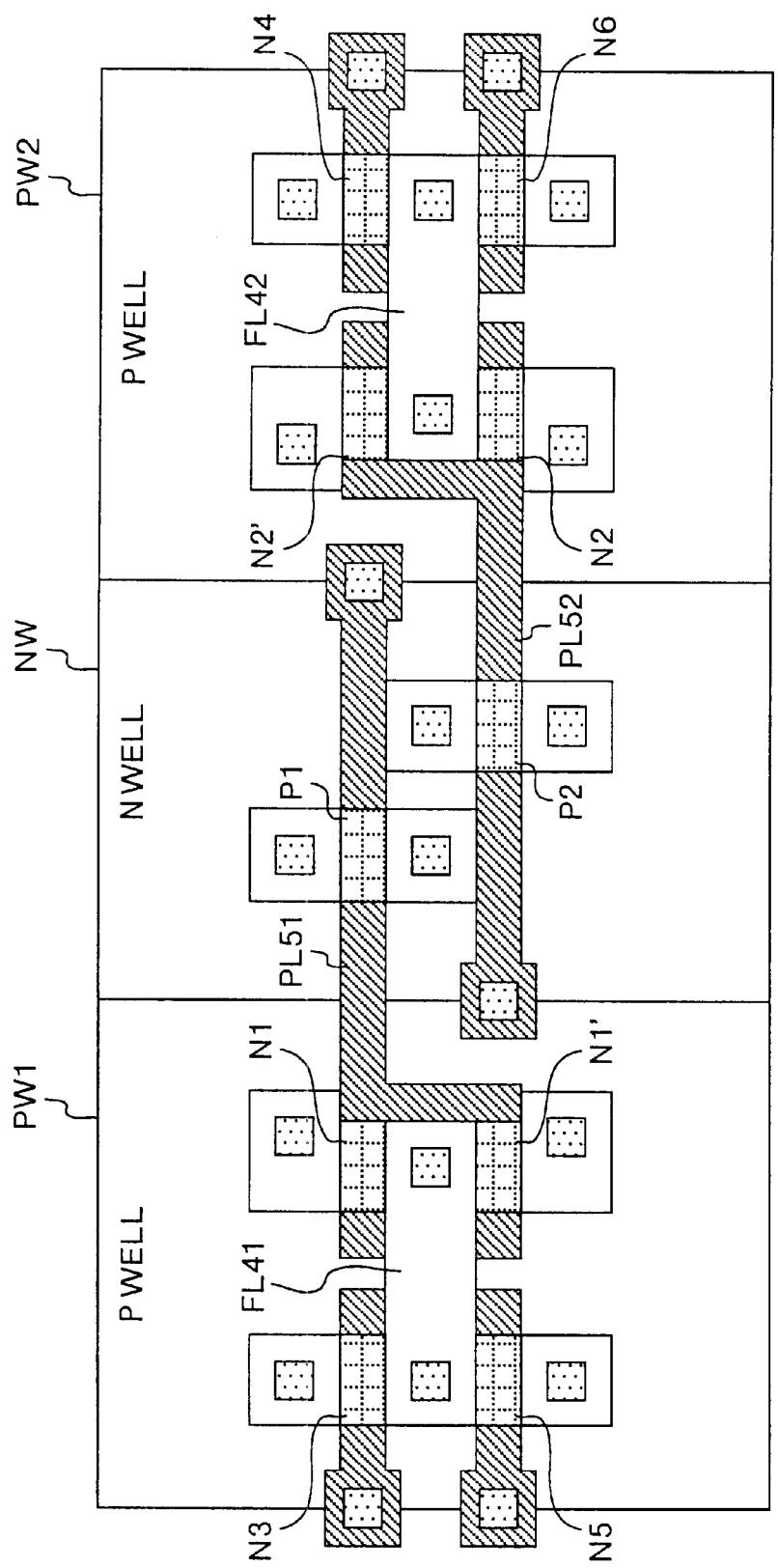
FIG. 7 is a diagram showing an example of the layout of a memory cell of a semiconductor memory device according to a second embodiment of the invention.

A semiconductor memory device of a second embodiment will be explained here. FIG. 7 is a layout diagram showing a memory cell of the semiconductor memory device of the second embodiment. FIG. 7 equivalent to FIG. 2.

The semiconductor memory device of the second embodiment is characterized by the following. Drain diffusion areas of N-channel type MOS transistors N3 and N5 and drain diffusion areas of N-channel type MOS transistors N1 and N1' are formed in a P-well area PW1 by a common $n^+$ diffusion area FL41. Further, drain diffusion areas of N-channel type MOS transistors N4 and N6 and drain diffusion areas of N-channel type MOS transistors N2 and N2' are formed in a P-well area PW2 by a common $n^+$ diffusion area FL 42.

Further, along with the above arrangement, polysilicon wiring layers PL51 and PL52 are formed in place of the polysilicon wiring layers PL11 and PL12 shown in FIG. 2. The layouts of other upper-layer metal-wiring layers are similar to those shown in FIG. 3 to FIG. 5, and therefore, their explanation will be omitted.

As explained above according to the semiconductor memory device of the second embodiment, it is possible to obtain all the effects of the first embodiment, based on the sharing of the $n^+$ diffusion areas as explained above.

It should be noted that the N-channel type MOS transistors N1' and N2' can be omitted from both the first and second embodiments.

Figure 8:
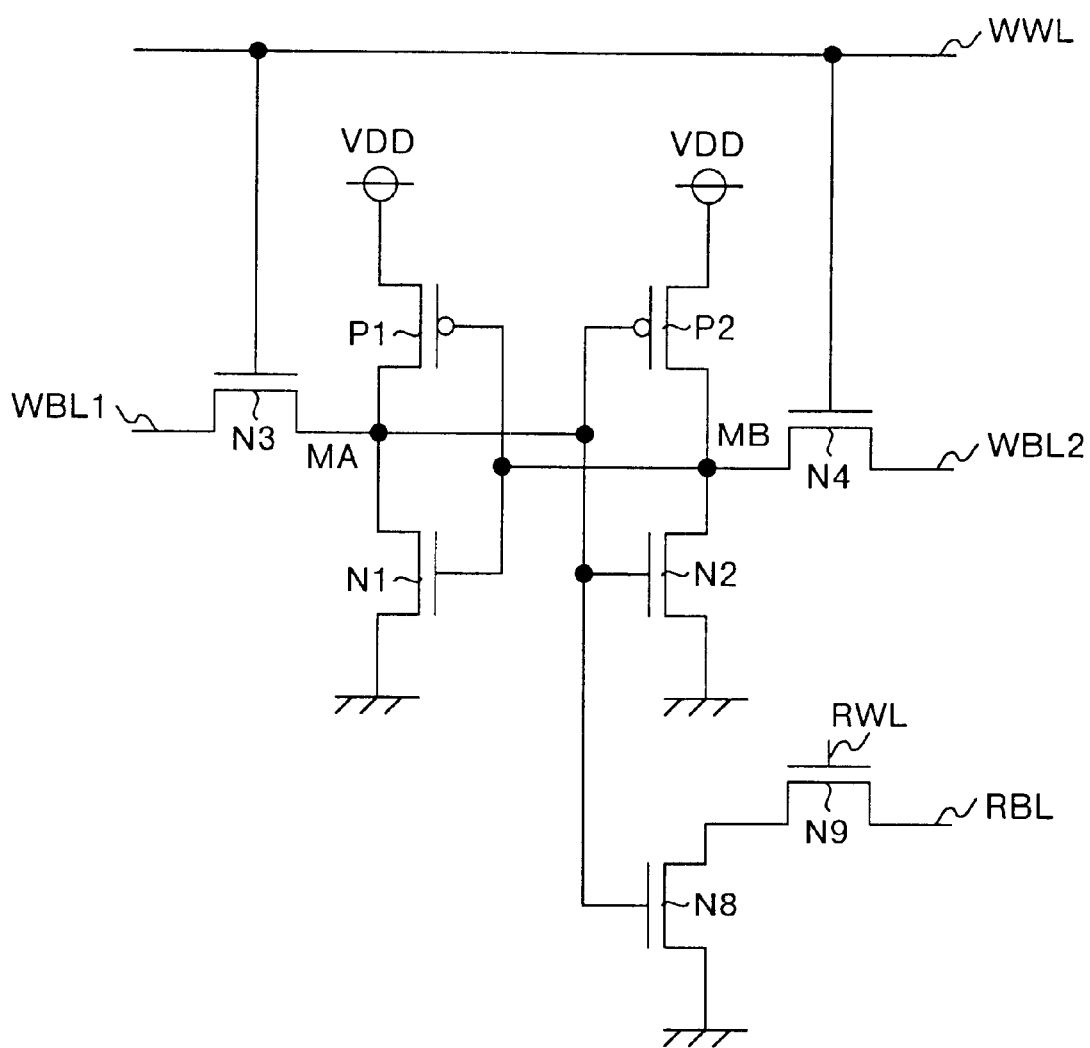
FIG. 8 is a diagram showing an equivalent circuit of a semiconductor memory device according to a third embodiment of the present invention.

Next, a semiconductor memory device of a third embodiment will be explained. The third embodiment is for explaining a layout structure of other equivalent circuit that structures a two-port SRAM cell. FIG. 8 shows an equivalent circuit of the semiconductor memory device of the third embodiment. As shown in FIG. 8, a P-channel type MOS transistor P1 and an N-channel type MOS transistor N1 constitute a first CMOS inverter. A P-channel type MOS transistor P2 and an N-channel type MOS transistor N2 constitute a second CMOS inverter. Input/output terminals of these CMOS inverters are connected in cross.

In other words, these MOS transistors P1, P2, N1, and N2 constitute a flip-flop circuit. In FIG. 8, it is possible to carry out a writing and a reading in a logic state in a memory node MA which is an output point of the first CMOS inverter and input point of the second CMOS inverter, and in a memory node MB which is an output point of the second CMOS inverter and input point of the first CMOS inverter.

N-channel type MOS transistors N3 and N4 function as access gates respectively. The gate of the N-channel type MOS transistor N3 is connected to a first word line WWL, the source is connected to the memory node MA, and the drain is connected to a first positive-phase bit line WBL1. The gate of the N-channel type MOS transistor N4 is connected to the first word line WWL, the source is connected to the memory node MA, and the gate is connected to a negative-phase bit line WBL2.

The gate of the N-channel type MOS transistor N8 is connected to the memory node MA, and the source of the N-channel type MOS transistor N8 is grounded. Further, the drain of the N-channel type MOS transistor N8 is connected to the source of an N-channel type MOS transistor N9. The gate of the N-channel type MOS transistor N9 is connected to the second word line RWL, and the drain is connected to a second positive-phase bit line RBL.

In other words, it is possible to read and write a memory value of a first port by selecting the word line WWL, the first positive-phase bit line WBL1 and the negative-phase bit line WBL2. It is possible to read a memory value of a second port by selecting the second word line RWL and the second positive-phase bit line RBL. Particularly, the read operation based on this second port has a characteristic in that this operation can be carried out completely independent of the first port, without destroying the data of the memory nodes MA and MB of the memory cell.

The equivalent circuit itself shown in FIG. 8 has a known structure as the conventional two-port SRAM cell. However, in the semiconductor memory device of the third embodiment, there is a characteristic in the construction of the memory cell. FIG. 9 to FIG. 12 are layout diagrams of the memory cell of the semiconductor memory device of the third embodiment. FIG. 6 explains various symbols like a contact hole, a via hole, etc. shown in FIG. 9 to FIG. 12.

Figure 9:
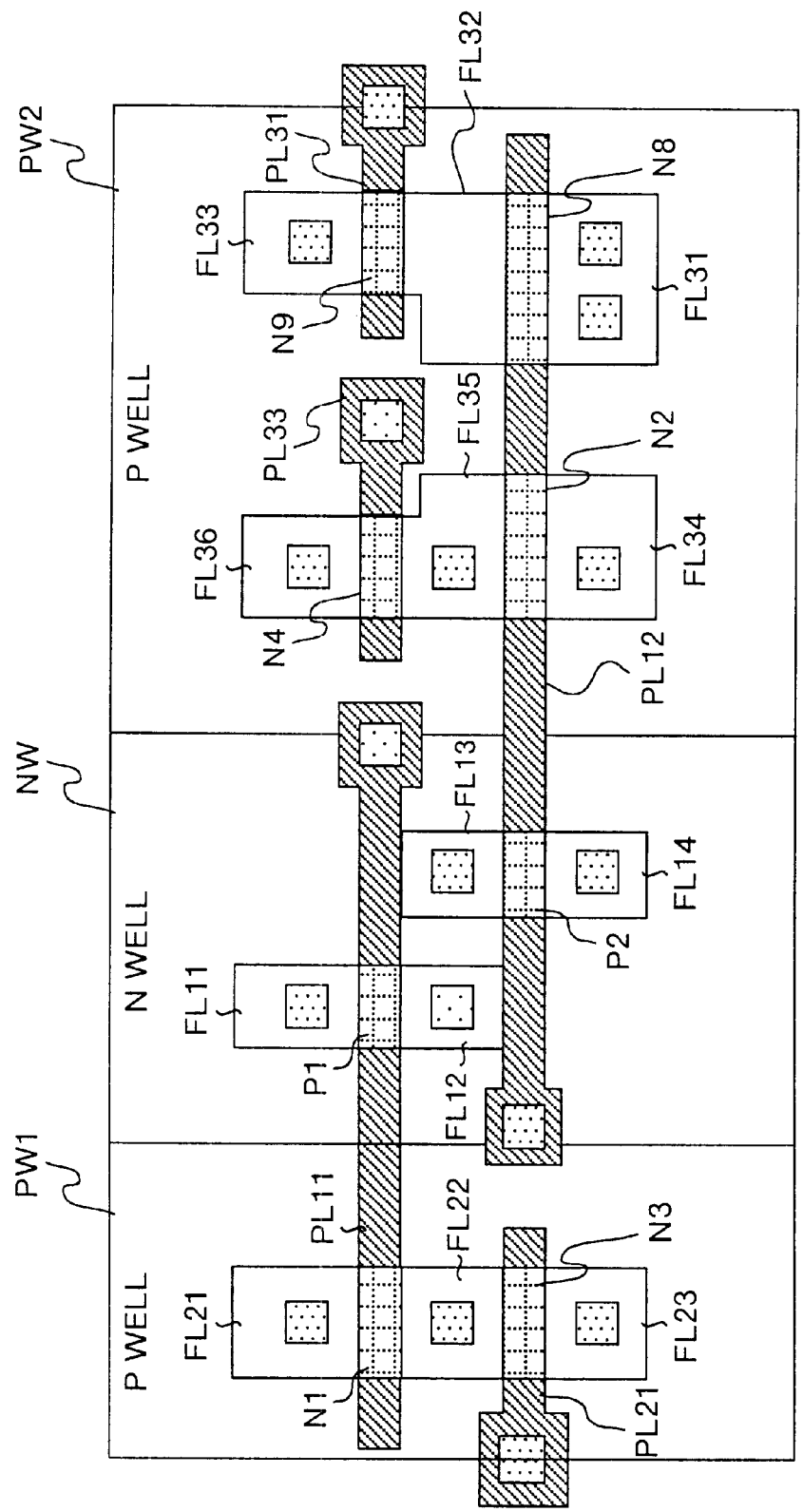
FIG. 9 is a diagram showing an example of the layout of a memory cell of the semiconductor memory device according to the third embodiment.

FIG. 9 shows layers including well areas formed on a semiconductor substrate, diffusion areas formed in the well areas, and a polysilicon wiring layer formed on the upper surface.

In the memory cell of the semiconductor memory device of the third embodiment, there are formed a first P-well area PW1 and a second P-well area PW2 by sandwiching the N-well area NW in a plain direction on the semiconductor substrate, as shown in FIG. 9, in a similar manner to that of the first embodiment. Further, these well areas are formed so that the first well boundary line and the second well boundary line are parallel with each other. Although not shown in FIG. 9, there exist a separation area between the N-well area NW and the first P-well area PW1 and between the N-well area NW and the second P-well area PW2 respectively.

In FIG. 9, the N-channel type MOS transistors N1 and N3 shown in FIG. 8 are formed in the first P-well area PW1. The P-channel type MOS transistors P1 and P2 shown in FIG. 8 are formed in the N-well area NW. Further, the N-channel type MOS transistors N2, N4, N8 and N9 shown in FIG. 8 are formed in the second P-well area PW2.

The construction of each layer shown in FIG. 9 to FIG. 12 will be explained in sequence. First, in the layers shown in FIG. 9, a polysilicon wiring layer PL21 is formed in the first P-well area PW1, extending in a direction perpendicular to the first well boundary line.

Further, a polysilicon wiring layer PL11 is disposed in the area from the first P-well area PW1 to the N-well area NW, extending in a straight line in a direction perpendicular to the first well boundary line. One end of the polysilicon wiring layer PL11 is positioned on the second well boundary line as shown in FIG. 9.

There are formed $n^+$ diffusion areas FL22 and FL23 in the first P-well area PW1 by injecting an N-type impurity at positions sandwiching the polysilicon wiring layer PL21. Thus, there is formed an N-channel type MOS transistor N3 that uses the polysilicon wiring layer PL21 as a gate electrode. Further, $n^+$ diffusion areas FL21 and FL22 are formed at positions sandwiching the polysilicon wiring layer PL11. Thus, there is formed an N-channel type MOS transistor N1 that uses the polysilicon wiring layer PL11 as a gate electrode.

Particularly, as the polysilicon wiring layers PL11 and PL21 are disposed in parallel in the N-channel type MOS transistors N1 and N3 respectively, it is possible to dispose the $n^+$ diffusion areas FL21 to FL23 in a direction parallel with the first well boundary line and also in a straight line. With this arrangement, the N-channel type MOS transistors N1 and N3 can share the $n^+$ diffusion area FL22. The sharing of this $n^+$ diffusion area FL22 makes it possible to connect the drain of the N-channel type MOS transistors N1 and the source of the N-channel type MOS transistors N3 together, and also contributes to reduce the area occupied by the N-channel type MOS transistors N1 and N3, according to the equivalent circuit shown in FIG. 8.

In the mean time, two polysilicon wiring layers PL31 and PL33 are disposed in the second P-well area PW2, extending in a direction perpendicular to the second well boundary line. Further, a polysilicon wiring layer PL12 is formed in the area from the second P-well area PW2 to the N-well area NW, extending in a direction perpendicular to the second well boundary line. One end of the polysilicon wiring layer PL12 is positioned on the first well boundary line as shown in FIG. 9.

There are formed $n^+$ diffusion areas FL36 and FL35 by injecting an N-type impurity at positions sandwiching the polysilicon wiring layer PL33. Thus, there is formed an N-channel type MOS transistor N4 that uses the polysilicon wiring layer PL33 as a gate electrode. Further, $n^+$ diffusion areas FL34 and FL35 are formed at positions sandwiching the polysilicon wiring layer PL12. Thus, there is formed an N-channel type MOS transistor N2 that uses the polysilicon wiring layer PL12 as a gate electrode.

As the polysilicon wiring layers PL33 and PL12 are disposed in parallel in the N-channel type MOS transistors N2 and N4 respectively, it is possible to dispose the $n^+$ diffusion areas FL34 to FL36 in a direction parallel with the second well boundary line and also in a straight line. With this arrangement, the N-channel type MOS transistors N2 and N4 can share the $n^+$ diffusion area FL35. The sharing of this $n^+$ diffusion area FL35 makes it possible to connect the drain of the N-channel type MOS transistors N2 and the source of the N-channel type MOS transistors N4 together, and also contributes to reduce the area occupied by the N-channel type MOS transistors N2 and N4, according to the equivalent circuit shown in FIG. 8.

Referring to FIG. 9, $n^+$ diffusion areas FL33 and FL32 are formed by injecting an N-type impurity at positions sandwiching the polysilicon wiring layer PL31. Thus, there is formed an N-channel type MOS transistor N9 that uses the polysilicon wiring layer PL31 as a gate electrode. Further, $n^+$ diffusion areas FL32 and FL31 are formed at positions sandwiching the polysilicon wiring layer PL12. Thus, there is formed an N-channel type MOS transistor N8 that uses the polysilicon wiring layer PL12 as a gate electrode.

These N-channel type MOS transistors N8 and N9 have the polysilicon wiring layer PL31 and PL12 disposed in parallel with each other. Therefore, it is possible to dispose the $n^+$ diffusion areas FL31 to FL33 in a direction parallel with the second well boundary line and also in a straight line. With this arrangement, the N-channel type MOS transistors N8 and N9 can share the $n^+$ diffusion area FL32. The sharing of this $n^+$ diffusion area FL32 makes it possible to connect the drain of the N-channel type MOS transistors N8 and the source of the N-channel type MOS transistor N9 together, and also contributes to reduce the area occupied by the N-channel type MOS transistors N8 and N9, according to the equivalent circuit shown in FIG. 8.

In the N-well area NW, $p^+$ diffusion areas FL11 and FL12 are formed by injecting a P-type impurity at positions sandwiching the polysilicon wiring layer PL11. Thus, there is formed a P-channel type MOS transistor P1 that uses the polysilicon wiring layer PL11 as a gate electrode. Further, $p^+$ diffusion areas FL13 and FL14 are formed at positions sandwiching the polysilicon wiring layer PL12. Thus, there is formed a P-channel type MOS transistor P2 that uses the polysilicon wiring layer PL12 as a gate electrode.

Positions of the P-channel type MOS transistors P1 and P2 are determined based on the positions of the polysilicon wiring layers PL11 and PL12. Distance between the polysilicon wiring layers PL11 and PL12 can be reduced to about the size of the $p^+$ diffusion area FL12 or the FL13 (minimum pitch of the transistor) as shown in FIG. 9, like in the first embodiment. Particularly, when the sizes of the $p^+$ diffusion areas FL12 and FL13 are set approximately equal to the sizes of the $n^+$ diffusion area FL22 in the first P-well area PW1 and the $n^+$ diffusion areas FL32 and FL35 in the second P-well area PW2, it is possible to minimize the total area required for the layout of the memory cell.

The above arrangement also means that it is possible to dispose the polysilicon wiring layers PL11, PL33 and PL31 on the same straight line, and it is also possible to dispose the polysilicon wiring layers PL21 and PL12 on the same straight line.

In order to have an electrical connection with the upper layer, there is one contact hole provided on each of the polysilicon wiring layers PL11, PL12, PL21, PL31 and PL33, the $p^+$ diffusion areas FL11 to FL14, and the $n^+$ diffusion areas FL21 to FL23 and FL33 to FL36, as shown in FIG. 9. There are also two contact holes provided in the n⁺ diffusion area FL31.

Figure 10:
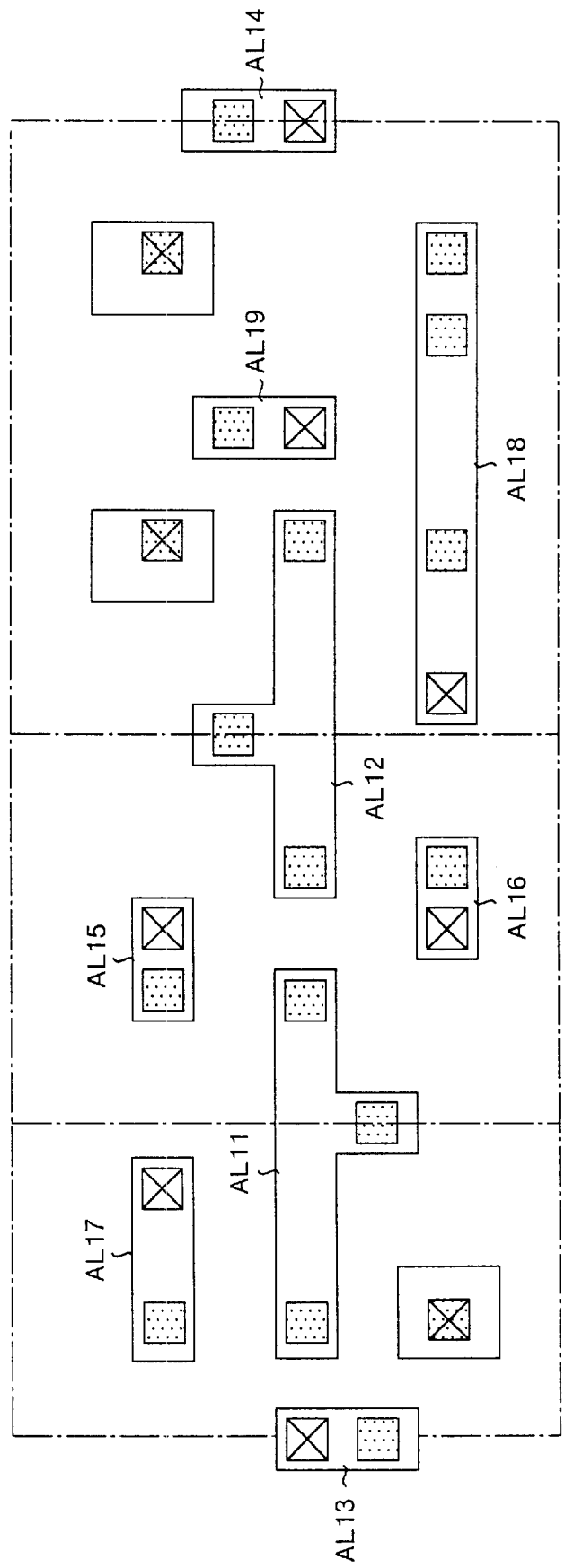
FIG. 10 is a diagram showing another example of the layout of the memory cell of the semiconductor memory device according to the third embodiment.

Next, layers positioned above the layers shown in FIG. 9 will be explained. FIG. 10 shows layers including first metal-wiring layers formed on the layers shown in FIG. 9. As one of layers shown in FIG. 10, there is formed a first metal-wiring layer AL11 for electrically connecting the lower-layer n⁺ diffusion area FL22, the p⁺ diffusion area FL12, and the polysilicon wiring layer PL12. This first metal-wiring layer AL11 makes it possible to connect the drain of the N-channel type MOS transistors N1, the source of the N-channel type MOS transistor N3, the drain of the P-channel type MOS transistor P1, and the input terminal of the second CMOS inverter, according to the equivalent circuit shown in FIG. 8.

Further, there is formed a first metal-wiring layer AL12 for electrically connecting between the lower-layer n⁺ diffusion area FL35, the p⁺ diffusion area FL13, and the polysilicon wiring layer PL11. This second metal-wiring layer AL12 makes it possible to connect between the drain of the N-channel type MOS transistor N2, the sources of the N-channel type MOS transistor N4, the drain of the P-channel type MOS transistor P2, and the input terminal of the first CMOS inverter, according to the equivalent circuit shown in FIG. 8.

Particularly, in the first metal-wiring layer AL11, the contact points of the n⁺ diffusion area FL22 and the p⁺ diffusion area FL12 are disposed on the same straight line as described above. Therefore, it is possible to form a wire for connecting between these two points in a straight-line shape. The above similarly applies to the first metal-wiring layer AL12.

Further, in layers shown in FIG. 10, there are formed a first metal-wiring layer AL15 for moving the connection point of the lower-layer p⁺ diffusion area FL11, and a first metal-wiring layer AL16 for moving the connection point of the p⁺ diffusion area FL14. There are also formed a first metal-wiring layer AL13 for moving the connection point of the lower-layer polysilicon wiring layer PL21, a first metal-wiring layer AL14 for moving the connection point of the polysilicon wiring layer PL31, and a first metal-wiring layer AL19 for moving the connection point of the polysilicon wiring layer PL33.

Further, on the same layer, there is formed a first metal-wiring layer AL18 for electrically connecting the lower-layer p⁺ diffusion areas FL34 and FL31, and for moving the connection point with the upper layer. This first metal-wiring layer AL18 makes it possible to connect the sources of the N-channel type MOS transistors N2 and N8 together, according to the equivalent circuit shown in FIG. 8.

Particularly, as shown in FIG. 9, the n⁺ diffusion areas FL34 and FL31 are disposed on the same straight line perpendicular to the second well boundary line. Therefore, the contact holes on these n⁺ diffusion areas can also be formed on the same straight line on which a straight line connecting between these contact holes is perpendicular to the second well boundary line. In other words, it is possible to form the second metal-wiring layer AL18 shown in FIG. 10 in a straight-line shape perpendicular to the second well boundary line.

Figure 11:
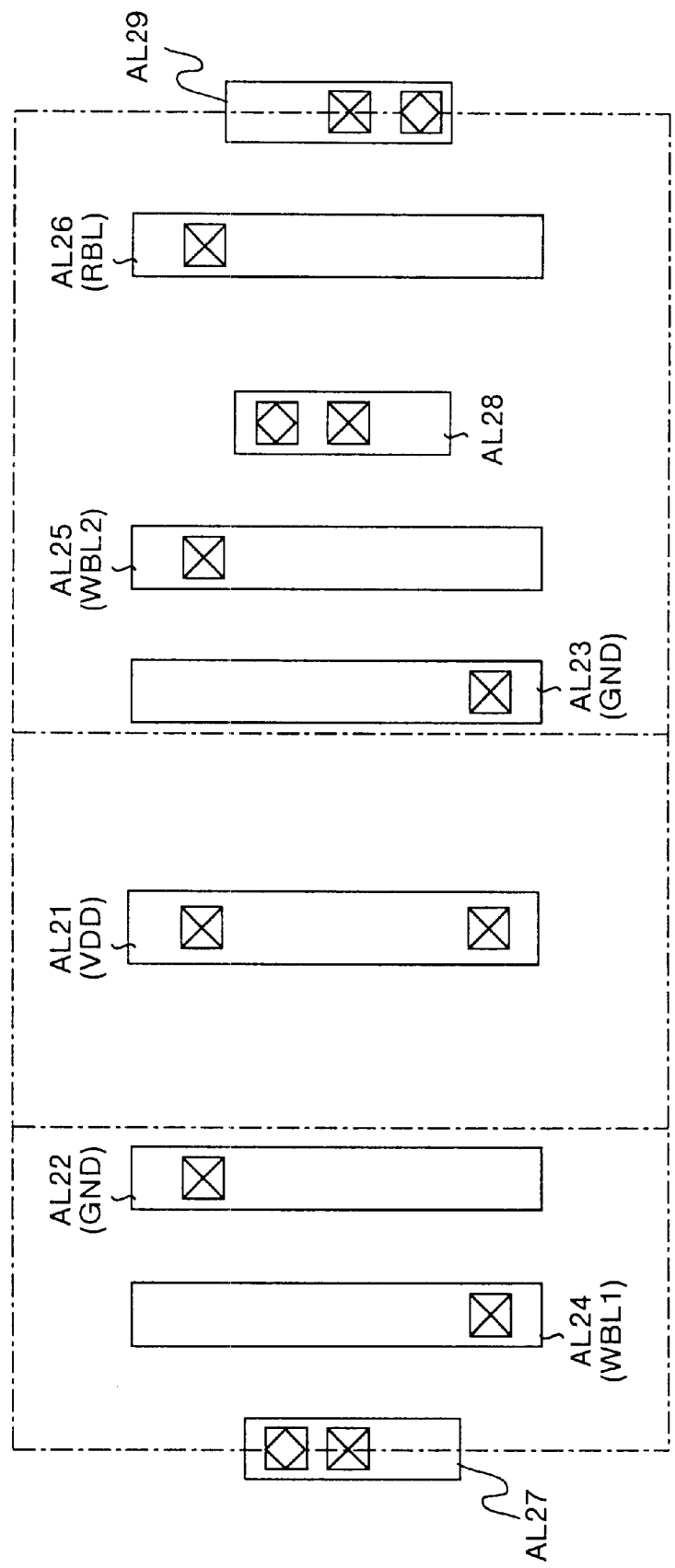
FIG. 11 is a diagram showing still another example of the layout of the memory cell of the semiconductor memory device according to the third embodiment.

Next, layers positioned above the layers shown in FIG. 10 will be explained. FIG. 11 shows layers including second metal-wiring layers formed on the layers shown in FIG. 10. As one of layers shown in FIG. 11, there is formed a second metal-wiring layer AL21 for applying a power source potential VDD to the p⁺ diffusion area FL11 via the first metal-wiring layer AL15 shown in FIG. 10 and for applying a power source potential VDD to the p⁺ diffusion area FL14 via the first metal-wiring layer AL16. In other words, the second metal-wiring layer AL21 functions as a power source potential VDD line, and achieves a connection between the source of the P-channel type MOS transistor P1 and the power source and a connection between the source of the P-channel type MOS transistor P2 and the power source, in the equivalent circuit shown in FIG. 8.

Further, there are formed a second metal-wiring layer AL22 for applying a ground potential GND to the p⁺ diffusion area FL21 via a first metal wiring layer AL17 shown in FIG. 10, and a second metal-wiring layer AL23 for applying a ground potential GND to the p⁺ diffusion areas FL31 and FL34 respectively via a first metal wiring layer AL18 shown in FIG. 10. In other words, the second metal-wiring layers AL22 and AL23 function as a ground potential GND line respectively, and achieve a grounding of each source of the N-channel type MOS transistors N1, N2 and N8 respectively, in the equivalent circuit shown in FIG. 8.

Further, as layers shown in FIG. 11, there are formed a second metal-wiring layer AL24 that is connected with the lower-layer p⁺ diffusion area FL23 and functions as a first positive-phase bit line WBL1, a second metal-wiring layer AL25 that is connected with the p⁺ diffusion area FL36 and functions as a negative-phase bit line WBL2, and a second metal-wiring layer AL26 that is connected with the p⁺ diffusion area FL33 and functions as a second positive-phase bit line RBL, via the contact holes and the first via holes shown in FIG. 10 respectively.

In other words, these second metal-wiring layers AL24 to AL26 achieve a connection between the other semiconductor terminal end (drain) of the N-channel type MOS transistor N3 and the first positive-phase bit line WBL1, a connection between the other semiconductor terminal end (drain) of the N-channel type MOS transistor N4 and the negative-phase bit line WBL2, and a connection between the other semiconductor terminal end (drain) of the N-channel type MOS transistor N9 and the second positive-phase bit line RBL, respectively, in the equivalent circuit shown in FIG. 8.

Particularly, it is possible to form the second metal-wiring layers AL24 to AL26 in a straight-line shape respectively extending in a direction parallel with the first well boundary line. This means that it is possible to further reduce the length of each of the first positive-phase bit line WBL1, the negative-phase bit line WBL2, and the second positive-phase bit line RBL, within one memory cell.

Further, as layers shown in FIG. 11, there are formed a second metal-wiring layer AL27 for moving the connection point between the lower-layer first metal wiring layer AL13 and the upper layer, a second metal-wiring layer AL28 for moving the connection point between the lower-layer first metal wiring layer AL19 and the upper layer, and a second metal-wiring layer AL29 for moving the connection point between the lower-layer first metal wiring layer AL14 and the upper layer.

Figure 12:
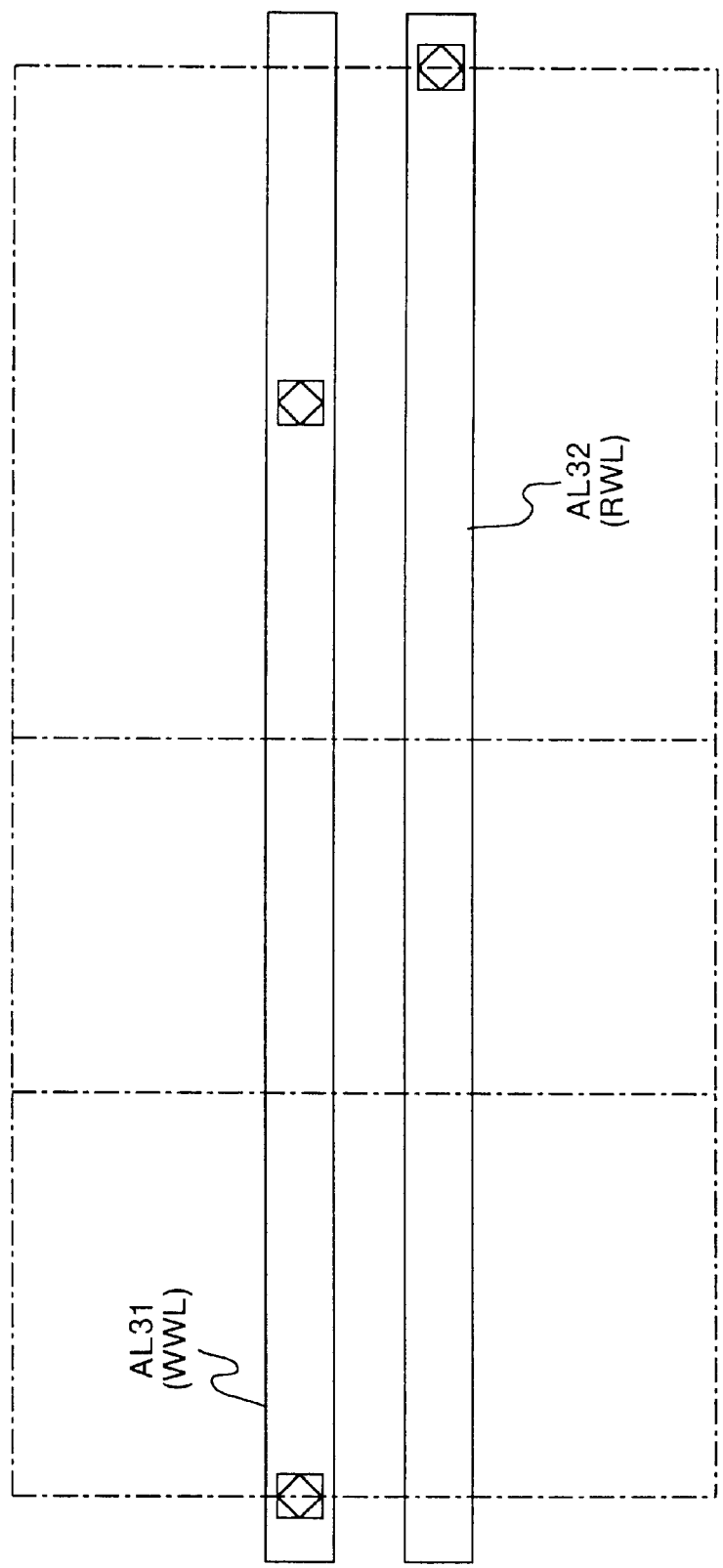
FIG. 12 is a diagram showing still another example of the layout of the memory cell of the semiconductor memory device according to the third embodiment.

Next, layers positioned above the layers shown in FIG. 11 will be explained. FIG. 12 shows layers including third metal-wiring layers formed on the layers shown in FIG. 11. As one of layers shown in FIG. 12, there is formed a third metal-wiring layer AL31 for electrically connecting the polysilicon wiring layers PL21 and PL33 via the first metal wiring layer AL13 and the second metal wiring layer AL27 and also for functioning as a word line WWL. In other words, the third metal-wiring layer AL31 achieves a connection between the gates of the N-channel type MOS transistors N3 and N4 and the word line WWL, in the equivalent circuit shown in FIG. 8.

Further, there is formed a third metal-wiring layer AL32 for electrically connecting with the polysilicon wiring layer PL31 via the first metal wiring layer AL14 and the second metal wiring layer AL29 and for functioning as a word line RWL. In other words, the third metal-wiring layer AL32 achieves a connection between the gate of the N-channel type MOS transistor N6 and the word line RWL, in the equivalent circuit shown in FIG. 8.

Particularly, as shown in FIG. 12, from the positional relationship between the second metal wiring layers AL27 and AL28, these metal wiring layers can be connected by a straight-line shaped metal wiring layer extending in a direction perpendicular to the first well boundary line. In other words, it is possible to form the third metal wiring layer AL31 shown in FIG. 12 in a straight-line shape extending in a direction perpendicular to the first well boundary line. In the mean time, as the third metal wiring layer AL32 is connected with only the second metal wiring layer AL29 as a lower layer, it is possible to dispose the third metal wiring layer AL32 in the extension parallel with the third metal wiring layer AL31. This means that it is possible to further reduce the length of each of the first word line WWL and the second word line RWL within one memory cell.

As explained above, according to the semiconductor memory device of the third embodiment, the N-channel type MOS transistor N3 that functions as an access gate and the N-channel type MOS transistor N1 that structures a flip-flop circuit share the $n^+$ diffusion area FL22 at a connection point between respective semiconductor terminals. At the same time, the $n^+$ diffusion areas FL21 to FL23 that become the respective semiconductor terminals are formed on the same straight line parallel with the first well boundary line. Therefore, it is possible to reduce the area occupied by the N-channel type MOS transistors N1 and N3. This makes it possible to increase the integration degree of the memory cell array.

Further, the second metal-wiring layers AL24 to AL26 that function as the first positive-phase bit line WBL1, the negative-phase bit line WBL2, and the first positive-phase bit line WBL2 in this order respectively are formed in parallel with the first and second well boundary lines respectively. Therefore, each bit line length can be reduced. As a result, it is possible to reduce the amount of wiring of the bit lines, which makes it possible to achieve a high-speed accessing. Particularly, each bit line length can be reduced to a double of the minimum pitch of the transistors based on the above arrangement.

Further, the third metal-wiring layers AL31 and AL32 that function as the first word line WWL and the second word line RWL respectively are formed so that these layers are orthogonal with the first and second well boundary lines respectively. Therefore, each word line length can be reduced. As a result, it is possible to reduce the amount of wiring of the word lines, which makes it possible to achieve a high-speed accessing.

Further, as the drain areas for forming the memory nodes MA and MB are made in a common $n^+$ diffusion area, it is possible to reduce the size of these areas. As a result, a parasitic capacitance can be reduced, which makes it possible to achieve a writing access at a higher speed.

Further, as the polysilicon layer can be formed in a straight line, it is possible to take a large process margin for a mask deviation or the like at the time of forming a layout pattern, in the process of manufacturing a semiconductor device.

Figure 13:
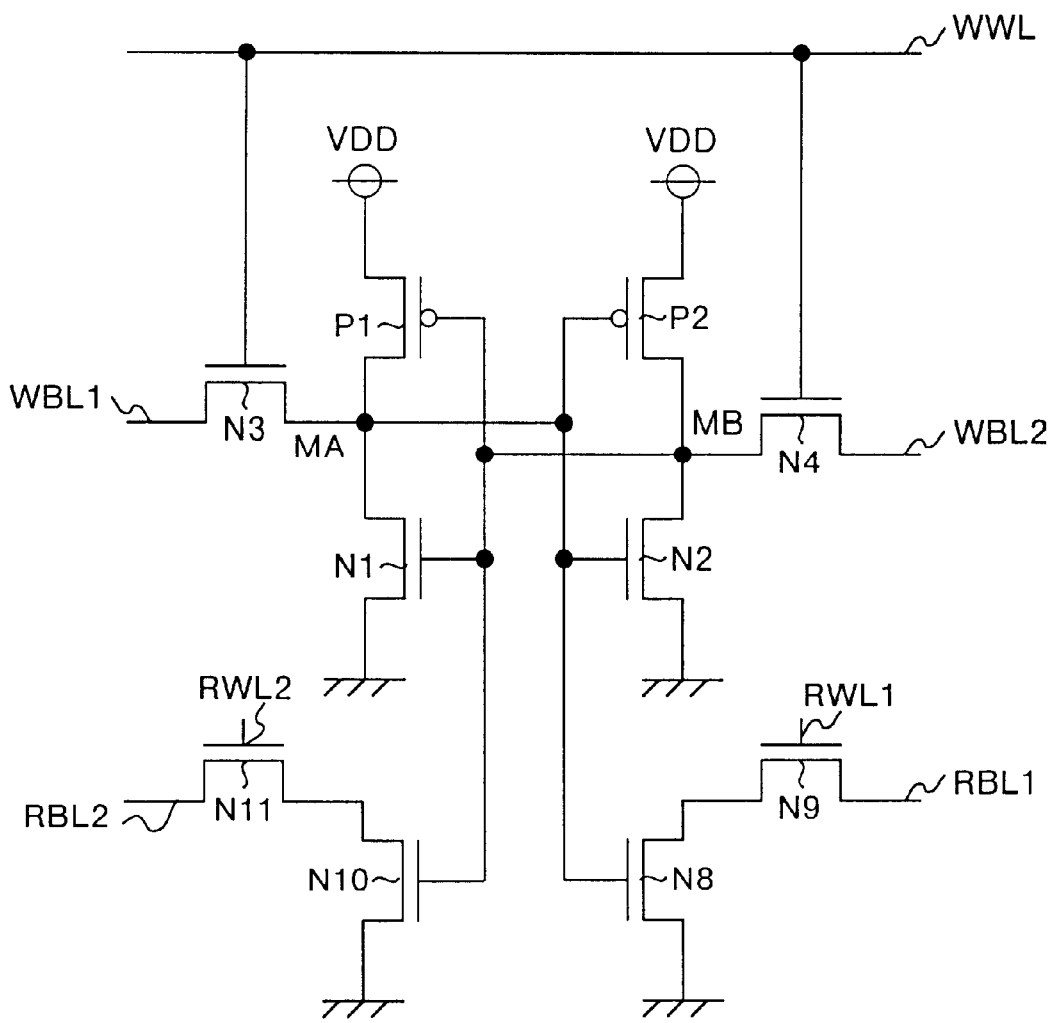
FIG. 13 is a diagram showing an equivalent circuit of a semiconductor memory device according to a fourth embodiment of the present invention.

Next, a semiconductor memory device of a fourth embodiment will be explained. The fourth embodiment is for explaining a layout structure of other equivalent circuit that structures a three-port SRAM cell. FIG. 13 shows an equivalent circuit of the semiconductor memory device of the fourth embodiment. In FIG. 13, a first word line WWL, a first positive-phase bit line WBL1, a first negative-phase bit line WBL2, P-channel type MOS transistors P1 and P2, and N-channel type MOS transistors N1 to N4 are as shown in FIG. 8. Therefore, their explanation will be omitted here.

In FIG. 13, in addition to the above-described structure, the gate of the N-channel type MOS transistor N8 is connected to the memory node MA, and the source of the N-channel type MOS transistor N8 is grounded. Further, the drain of the N-channel type MOS transistor N8 is connected to the source of the N-channel type MOS transistor N9. The gate of the N-channel type MOS transistor N9 is connected to a second word line RWL1, and the drain is connected to a second positive-phase bit line RBL1.

The gate of the N-channel type MOS transistor N10 is connected to the memory node MB, and the source of the N-channel type MOS transistor N10 is grounded. Further, the drain of the N-channel type MOS transistor N10 is connected to the source of an N-channel type MOS transistor N11. The gate of the N-channel type MOS transistor N11 is connected to a third word line RWL2, and the drain is connected to a second negative-phase bit line RBL2.

In other words, it is possible to read and write a memory value of a first port by selecting the word line WWL, the first positive-phase bit line WBL1 and the negative-phase bit line WBL2. It is possible to read a memory value of a second port by selecting the second word line RWL1 and the second positive-phase bit line RBL1. Further, it is possible to read a memory value of a third port by selecting the third word line RWL2 and the second negative-phase bit line RBL2. Particularly, the read operation based on the second and third ports has a characteristic in that this operation can be carried out completely independent of the first port, without destroying the data of the memory nodes MA and MB of the memory cell.

The equivalent circuit itself shown in FIG. 13 has a known structure as the conventional three-port SRAM cell. However, in the semiconductor memory device of the fourth embodiment, there is a characteristic in the construction of the memory cell. FIG. 14 to FIG. 17 are layout diagrams of the memory cell of the semiconductor memory device of the fourth embodiment. FIG. 6 explains various symbols like a contact hole, a via hole, etc. shown in FIG. 14 to FIG. 17.

Figure 14:
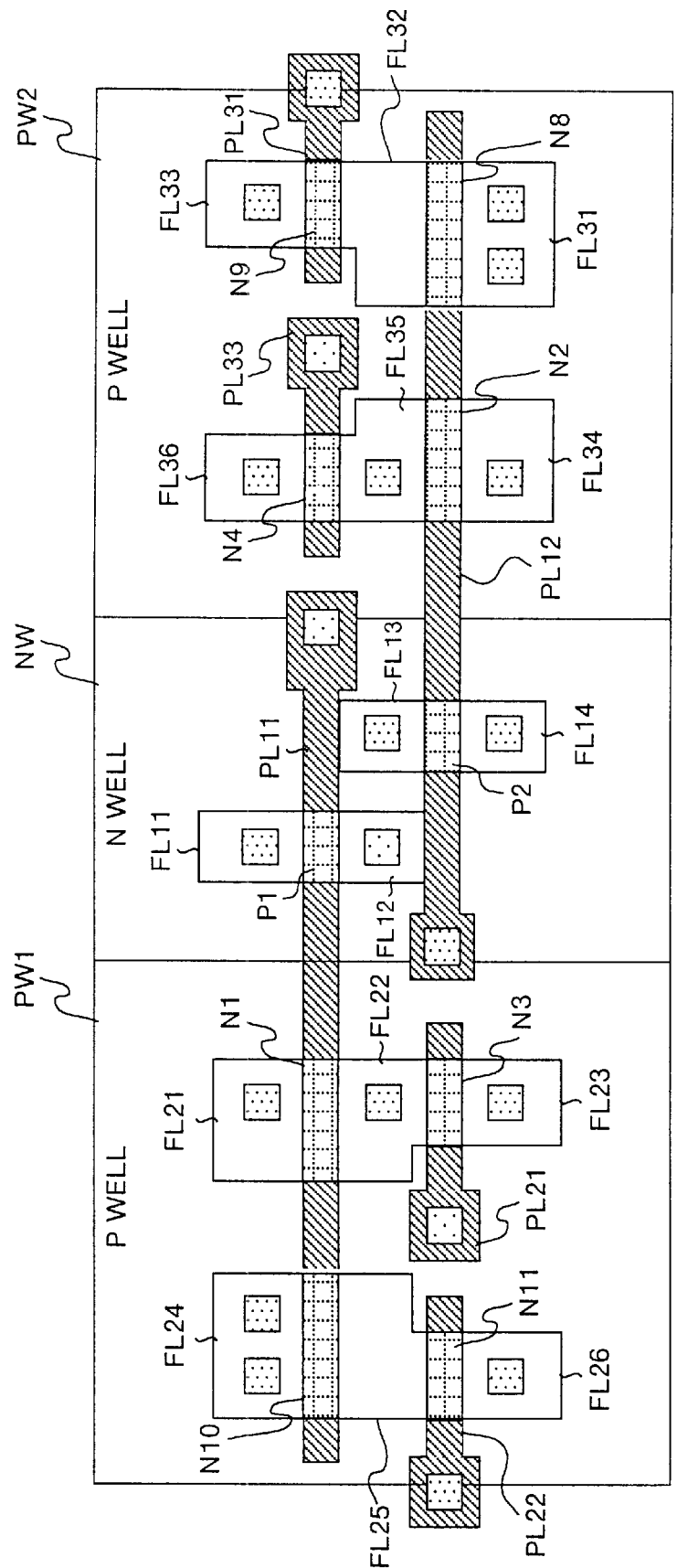
FIG. 14 is a diagram showing an example of the layout of the memory cell of the semiconductor memory device according to the fourth embodiment.

FIG. 14 shows layers including well areas formed on a semiconductor substrate, diffusion areas formed in the well areas, and a polysilicon wiring layer formed on the upper surface.

In the memory cell of the semiconductor memory device of the fourth embodiment as well, there are formed a first P-well area PW1 and a second P-well area PW2 by sandwiching the N-well area NW in a plain direction on the semiconductor substrate, as shown in FIG. 14, in a similar manner to that of the first embodiment. Further, these well areas are formed so that the first well boundary line and the second well boundary line are parallel with each other. Although not shown in FIG. 14, there exist a separation area between the N-well area NW and the first P-well area PW1 and between the N-well area NW and the second P-well area PW2 respectively.

In FIG. 14, the N-channel type MOS transistors N1, N3, N10 and N11 shown in FIG. 13 are formed in the first P-well area PW1. The P-channel type MOS transistors P1 and P2 shown in FIG. 13 are formed in the N-well area NW. Further, the N-channel type MOS transistors N2, N4, N8 and N9 shown in FIG. 13 are formed in the second P-well area PW2.

The construction of each layer shown in FIG. 14 to FIG. 17 will be explained in sequence. First, in the layers shown in FIG. 14, two polysilicon wiring layers PL21 and PL22 are formed in the first P-well area PW1, extending in parallel in a direction perpendicular to the first well boundary line.

Further, a polysilicon wiring layer PL11 is disposed in the area from the first P-well area PW1 to the N-well area NW, extending in a straight line in a direction perpendicular to the first well boundary line. One end of the polysilicon wiring layer PL11 is positioned on the second well boundary line as shown in FIG. 14.

There are formed $n^+$ diffusion areas FL22 and FL23 by injecting an N-type impurity at positions sandwiching the polysilicon wiring layer PL21. Thus, there is formed an N-channel type MOS transistor N3 that uses the polysilicon wiring layer PL21 as a gate electrode. Further, $n^+$ diffusion areas FL21 and FL22 are formed at positions sandwiching the polysilicon wiring layer PL11. Thus, there is formed an N-channel type MOS transistor N1 that uses the polysilicon wiring layer PL11 as a gate electrode.

Particularly, as the polysilicon wiring layers PL11 and PL21 are disposed in parallel in the N-channel type MOS transistors N1 and N3 respectively, it is possible to dispose the $n^+$ diffusion areas FL21 to FL23 in a direction parallel with the first well boundary line and also in a straight line. With this arrangement, the N-channel type MOS transistors N1 and N3 can share the $n^+$ diffusion area FL22. The sharing of this $n^+$ diffusion area FL22 makes it possible to connect the drain of the N-channel type MOS transistors N1 and the source of the N-channel type MOS transistors N3 together, and also contributes to reduce the area occupied by the N-channel type MOS transistors N1 and N3, according to the equivalent circuit shown in FIG. 13.

In FIG. 14, there are formed $n^+$ diffusion areas FL25 and FL26 by injecting an N-type impurity at positions sandwiching the polysilicon wiring layer PL22. Thus, there is formed an N-channel type MOS transistor N11 that uses the polysilicon wiring layer PL22 as a gate electrode. Further, $n^+$ diffusion areas FL24 and FL25 are formed at positions sandwiching the polysilicon wiring layer PL11. Thus, there is formed an N-channel type MOS transistor N10 that uses the polysilicon wiring layer PL11 as a gate electrode.

As the polysilicon wiring layers PL22 and PL11 are disposed in parallel in the N-channel type MOS transistors N10 and N11 respectively, it is possible to dispose the $n^+$ diffusion areas FL24 to FL26 in a direction parallel with the first well boundary line and also in a straight line. With this arrangement, the N-channel type MOS transistors N10 and N11 can share the $n^+$ diffusion area FL25. The sharing of this $n^+$ diffusion area FL25 makes it possible to connect the drain of the N-channel type MOS transistors N10 and the source of the N-channel type MOS transistors N11 together, and also contributes to reduce the area occupied by the N-channel type MOS transistors N10 and N11, according to the equivalent circuit shown in FIG. 13.

In the mean while, the formation of the diffusion area and the polysilicon wiring layer in the second P-well area PW2 and the N-well area NW is as explained in the third embodiment with reference to FIG. 9. Therefore, their explanation will be omitted here.

Therefore, as shown in FIG. 14, the polysilicon wiring layers PL11, PL33 and PL31 are disposed on the same straight line, and the polysilicon wiring layers PL21, PL22 and PL12 are disposed on the same straight line.

In order to have an electrical connection with the upper layer, there is one contact hole provided on each of the polysilicon wiring layers PL11, PL12, PL21, PL22, PL31 and PL33, the $p^+$ diffusion areas FL11 to FL14, and the $n^+$ diffusion areas FL21 to FL23, FL26, and FL33 to FL36, as shown in FIG. 14. There are also two contact holes provided in the $n^+$ diffusion areas FL24 and FL31.

Figure 15:
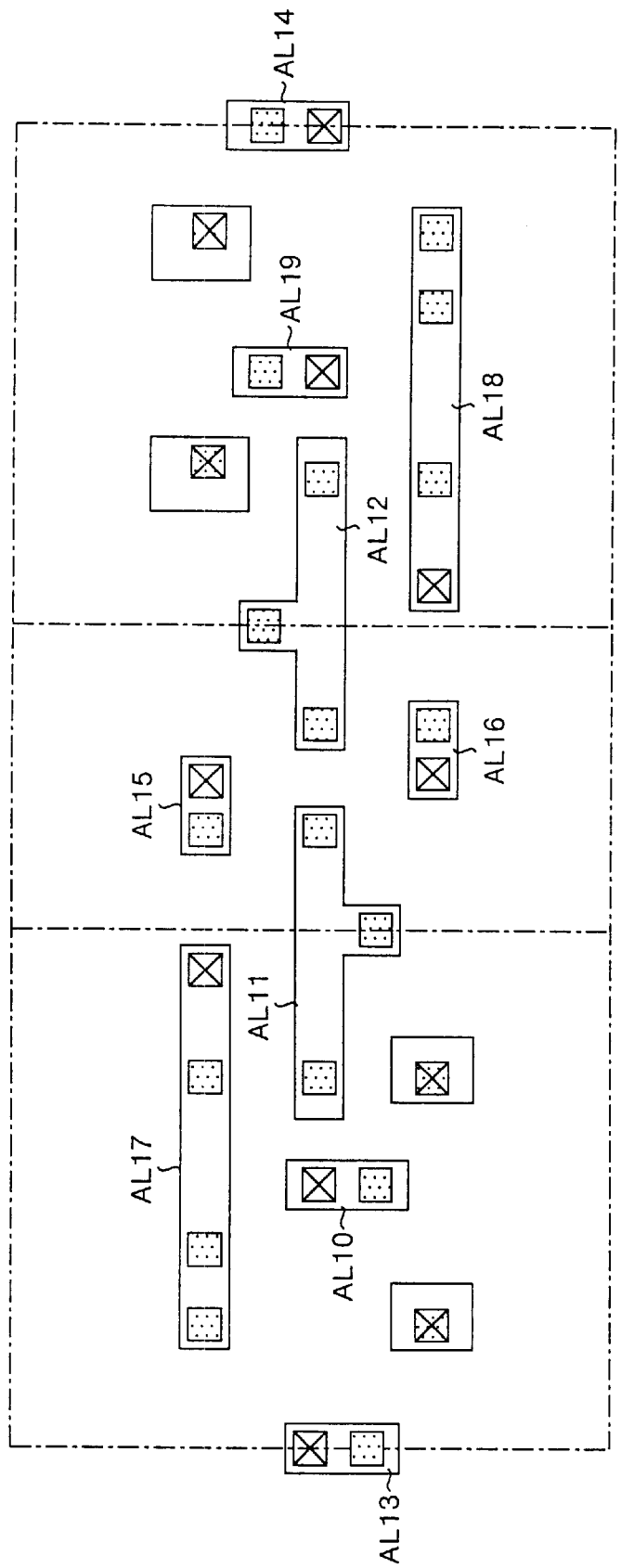
FIG. 15 is a diagram showing another example of the layout of the memory cell of the semiconductor memory device according to the fourth embodiment.

Next, layers positioned above the layers shown in FIG. 14 will be explained. FIG. 15 shows layers including first metal-wiring layers formed on the layers shown in FIG. 14. In the layers shown in FIG. 15, the formation of the second metal wiring layers in the second P-well area PW2 and the N-well area NW is as explained in the third embodiment with reference to FIG. 10. Therefore, their explanation will be omitted here.

In layers shown in FIG. 15, in the first P-well area PW1, there is formed a first metal-wiring layer AL11 for electrically connecting the lower-layer $n^+$ diffusion area FL22, the $p^+$ diffusion area FL12, and the polysilicon wiring layer PL12. This first metal-wiring layer AL11 makes it possible to connect the drain of the N-channel type MOS transistors N1, the source of the N-channel type MOS transistor N3, the drain of the P-channel type MOS transistor P1, and the input terminal of the second CMOS inverter, according to the equivalent circuit shown in FIG. 13.

Particularly, in the first metal-wiring layer AL11, the contact points of the $n^+$ diffusion area FL22 and the $p^+$ diffusion area FL12 are disposed on the same straight line as described above. Therefore, it is possible to form a wire for connecting between these two points in a straight-line shape.

Further, in layers shown in FIG. 15, there are formed a first metal-wiring layer AL13 for moving the connection point of the lower-layer polysilicon wiring layer PL22, and a first metal-wiring layer AL10 for moving the connection point of the polysilicon wiring layer PL21.

Further, on the same layer, there is formed a first metal-wiring layer AL17 for electrically connecting the lower-layer $p^+$ diffusion areas FL24 and FL21, and for moving the connection point with the upper layer. This first metal-wiring layer AL17 makes it possible to connect the sources of the N-channel type MOS transistors N1 and N10 together, according to the equivalent circuit shown in FIG. 13.

Particularly, as shown in FIG. 14, the $n^+$ diffusion areas FL24 and FL21 are disposed on the same straight line perpendicular to the first well boundary line. Therefore, the contact holes on these $n^+$ diffusion areas can also be formed on the same straight line on which a straight line connecting between these contact holes is perpendicular to the first well boundary line. In other words, it is possible to form the second metal-wiring layer AL17 shown in FIG. 15 in a straight-line shape perpendicular to the first well boundary line.

Figure 16:
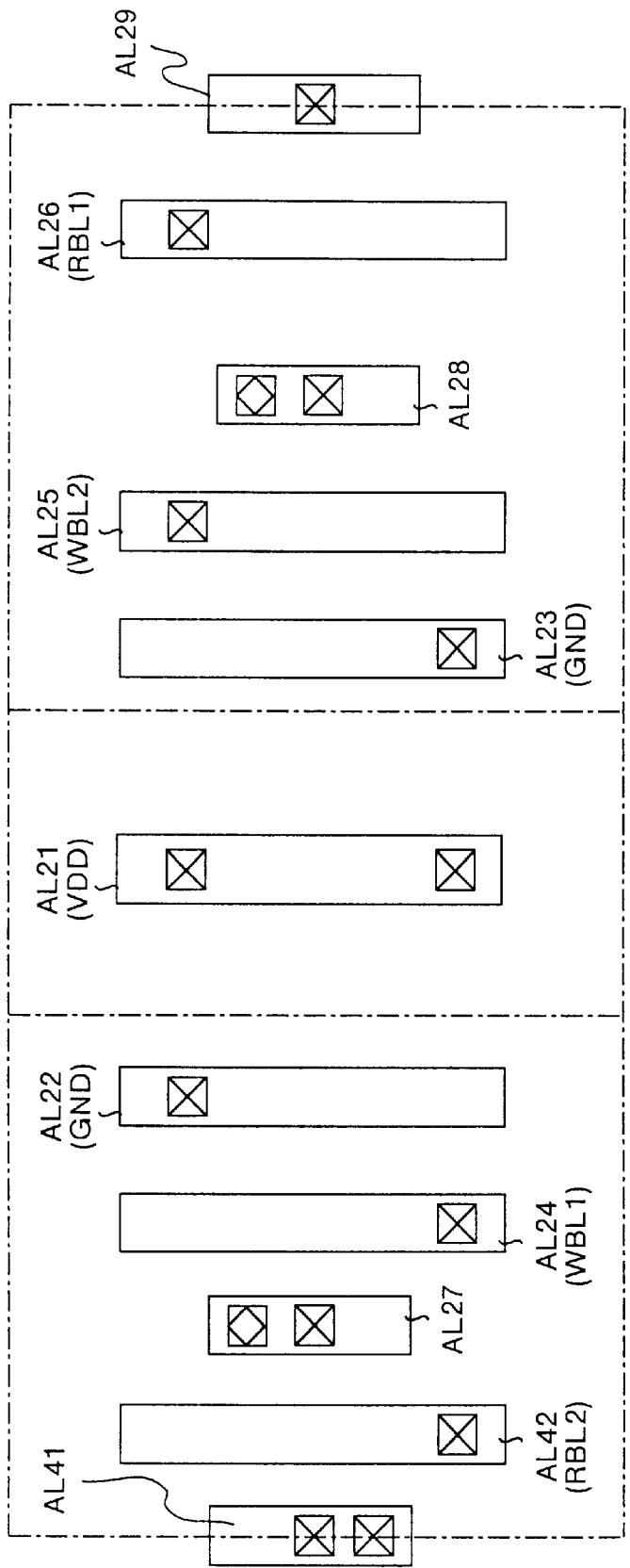
FIG. 16 is a diagram showing still another example of the layout of the memory cell of the semiconductor memory device according to the fourth embodiment.

Next, layers positioned above the layers shown in FIG. 15 will be explained. FIG. 16 shows layers including second metal-wiring layers formed on the layers shown in FIG. 15. As one of layers shown in FIG. 16, there is formed a second metal-wiring layer AL21 for applying a power source potential VDD to the $p^+$ diffusion area FL11 via the first metal-wiring layer AL15 shown in FIG. 15 and for applying a power source potential VDD to the $p^+$ diffusion area FL14 via the first metal-wiring layer AL16. In other words, the second metal-wiring layer AL21 functions as a power source potential VDD line, and achieves a connection between the source of the P-channel type MOS transistor P1 and the power source and a connection between the source of the P-channel type MOS transistor P2 and the power source, in the equivalent circuit shown in FIG. 13.

Further, there are formed a second metal-wiring layer AL22 for applying a ground potential GND to the p+ diffusion areas FL21 and FL24 via a first metal wiring layer AL17 shown in FIG. 15, and a second metal-wiring layer AL23 for applying a ground potential GND to the p+ diffusion areas FL31 and FL34 respectively via a first metal wiring layer AL18 shown in FIG. 15. In other words, the second metal-wiring layers AL22 and AL23 function as a ground potential GND line respectively, and achieve a grounding of each source of the N-channel type MOS transistors N1, N2, N8 and N10 respectively, in the equivalent circuit shown in FIG. 13.

Further, as layers shown in FIG. 16, there are formed a second metal-wiring layer AL24 that is connected with the lower-layer p+ diffusion area FL23 and functions as a first positive-phase bit line WBL1, a second metal-wiring layer AL42 that is connected with the lower-layer p+ diffusion area FL26 and functions as a second negative-phase bit line RBL2, a second metal-wiring layer AL25 that is connected with the p+ diffusion area FL36 and functions as a negative-phase bit line WBL2, and a second metal-wiring layer AL26 that is connected with the p+ diffusion area FL33 and functions as a second positive-phase bit line RBL1, via the contact holes and the first via holes shown in FIG. 15 respectively.

In other words, these second metal-wiring layers AL24 to AL26 and AL42 achieve a connection between the other semiconductor terminal end (drain) of the N-channel type MOS transistor N3 and the first positive-phase bit line WBL1, a connection between the other semiconductor terminal end (drain) of the N-channel type MOS transistor N4 and the negative-phase bit line WBL2, a connection between the other semiconductor terminal end (drain) of the N-channel type MOS transistor N9 and the second positive-phase bit line RBL1, and a connection between the other semiconductor terminal end (drain) of the N-channel type MOS transistor N11 and the second negative-phase bit line RBL2, respectively, in the equivalent circuit shown in FIG. 13.

Particularly, it is possible to form the second metal-wiring layers AL24 to AL26 and AL42 in a straight-line shape respectively extending in a direction parallel with the first well boundary line. This means that it is possible to further reduce the length of each of the first positive-phase bit line WBL1, the negative-phase bit line WBL2, the second positive-phase bit line RBL1, and the second negative-phase bit line RBL2 within one memory cell.

Further, as layers shown in FIG. 16, there are formed a second metal-wiring layer AL41 for moving the connection point between the lower-layer first metal wiring layer AL13 and the upper layer, a second metal-wiring layer AL28 for moving the connection point between the lower-layer first metal wiring layer AL19 and the upper layer, and a second metal-wiring layer AL27 for moving the connection point between the lower-layer first metal wiring layer AL10 and the upper layer. Further, there is formed a second metal-wiring layer AL29 for connecting between the polysilicon wiring layer PL31 and the upper layer via the lower-layer first metal wiring layer AL14.

Figure 17:
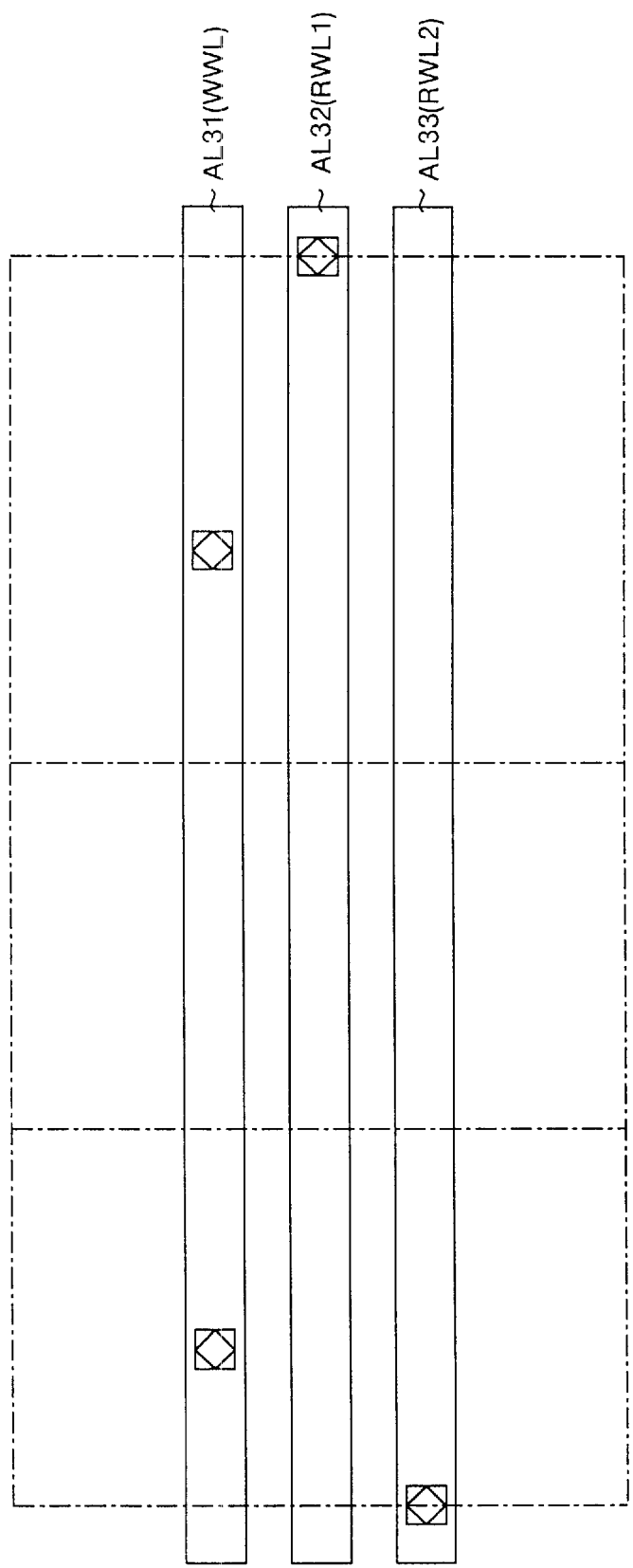
FIG. 17 is a diagram showing still another example of the layout of the memory cell of the semiconductor memory device according to the fourth embodiment.

Next, layers positioned above the layers shown in FIG. 16 will be explained. FIG. 17 shows layers including third metal-wiring layers formed on the layers shown in FIG. 16. As one of layers shown in FIG. 17, there is formed a third metal-wiring layer AL31 for electrically connecting the polysilicon wiring layers PL21 and PL33 via the first metal wiring layer AL10 and the second metal wiring layer AL27 and also for functioning as a first word line WWL. In other words, the third metal-wiring layer AL31 achieves a connection between the gates of the N-channel type MOS transistors N3 and N4 and the first word line WWL, in the equivalent circuit shown in FIG. 13.

Further, there is formed a third metal-wiring layer AL32 for electrically connecting with the polysilicon wiring layer PL31 via the first metal wiring layer AL14 and the second metal wiring layer AL29 and for functioning as a second word line RWL1. In other words, the third metal-wiring layer AL32 achieves a connection between the gate of the N-channel type MOS transistor N6 and the second word line RWL1, in the equivalent circuit shown in FIG. 13.

Further, there is formed a third metal-wiring layer AL33 for electrically connecting with the polysilicon wiring layer PL22 via the first metal wiring layer AL13 and the second metal wiring layer AL41 and for functioning as a third word line RWL2. In other words, the third metal-wiring layer AL33 achieves a connection between the gate of the N-channel type MOS transistor N11 and the third word line RWL2, in the equivalent circuit shown in FIG. 13.

Particularly, as shown in FIG. 17, from the positional relationship between the second metal wiring layers AL27 and AL28, these metal wiring layers can be connected by a straight-line shaped metal wiring layer extending in a direction perpendicular to the first well boundary line. In other words, it is possible to form the third metal wiring layer AL31 shown in FIG. 17 in a straight-line shape extending in a direction perpendicular to the first well boundary line. In the mean time, the third metal wiring layer AL32 is connected with only the second metal wiring layer AL29 as a lower layer, and the third metal wiring layer AL33 is connected with only the second metal wiring layer AL41 as a lower layer. Therefore, it is possible to dispose these third metal wiring layers in the extension parallel with the third metal wiring layer AL31. This means that it is possible to further reduce the length of each of the first word line WWL, the second word line RWL1, and the third word line RWL2, within one memory cell.

As explained above, according to the semiconductor memory device of the fourth embodiment, it is also possible to obtain the effect of the third embodiment in the three-port SRAM cell as well.

Figure 18:
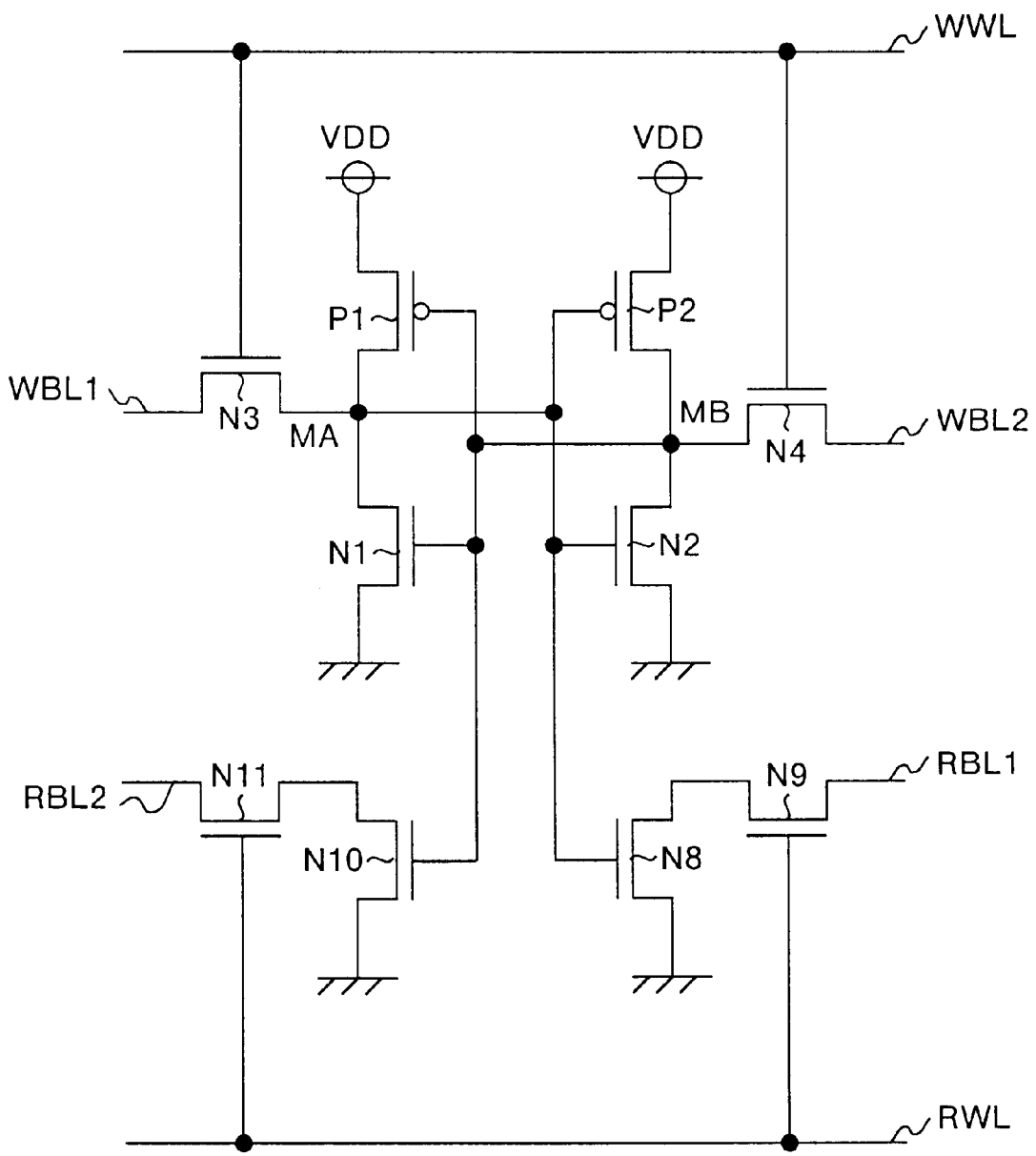
FIG. 18 is a diagram showing an equivalent circuit of a semiconductor memory device according to a fifth embodiment of the present invention.

Next, a semiconductor memory device of a fifth embodiment will be explained. The fifth embodiment is for explaining a layout structure of other equivalent circuit that structures a differential-reading-type two-port SRAM cell. FIG. 18 shows an equivalent circuit of the semiconductor memory device of the fifth embodiment.

The equivalent circuit shown in FIG. 18 is different from that of the fourth embodiment only in that the gates of the N-channel type MOS transistors N9 and N11 are connected together, and the connection line is used as a common second word line RWL, in the equivalent circuit shown in FIG. 13. All other structures are as shown in FIG. 13, and therefore, their explanation will be omitted here.

Accordingly, the operation is also similar to that of the equivalent circuit shown in FIG. 13 except that the read operation is carried out based on the difference between the potential of the second positive-phase bit line RBL1 and the potential of the second negative-phase bit line RBL2.

The layout structure is different only in the second metal wiring layer corresponding to that shown in FIG. 16 and the third metal wiring layer corresponding to that shown in FIG. 17. All other lower-layer structures are as shown in FIG. 14 and FIG. 15. Therefore, their explanation will be omitted here.

Figure 19:
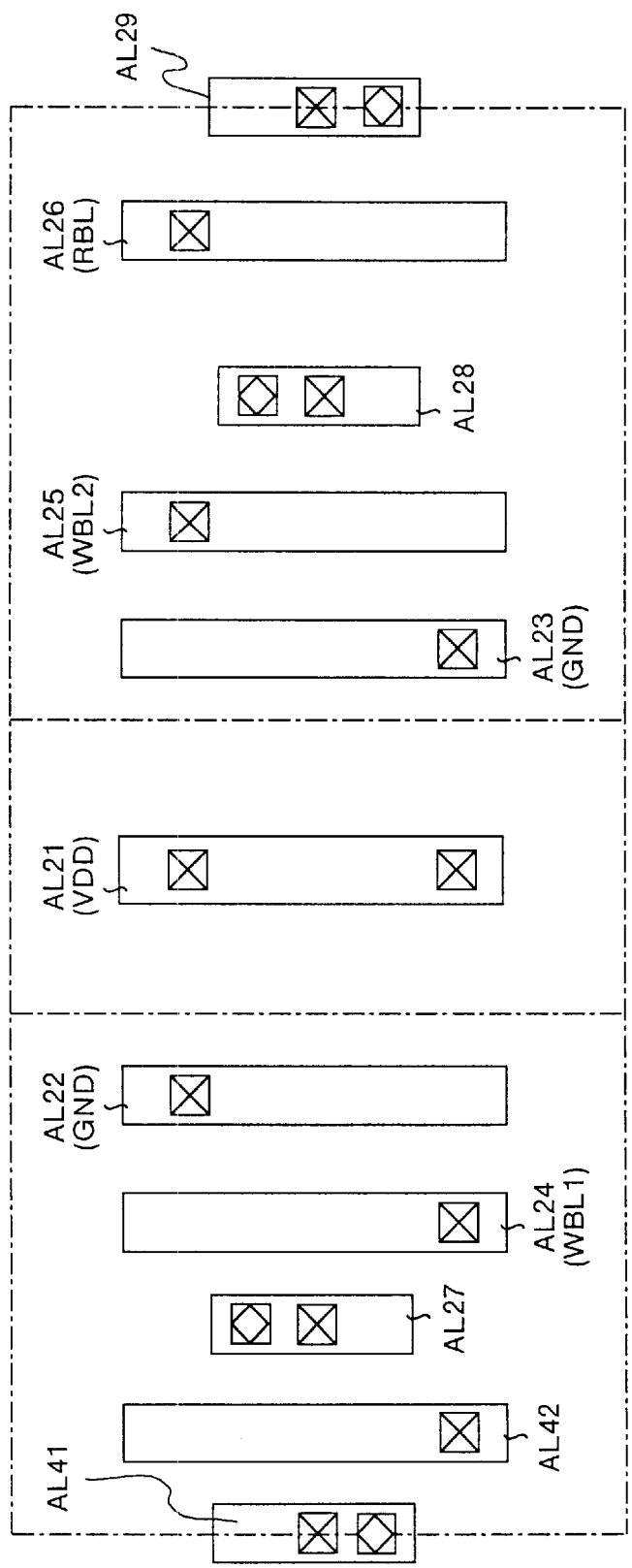
FIG. 19 is a diagram showing an example of the layout of the memory cell of the semiconductor memory device according to the fifth embodiment.
Figure 20:
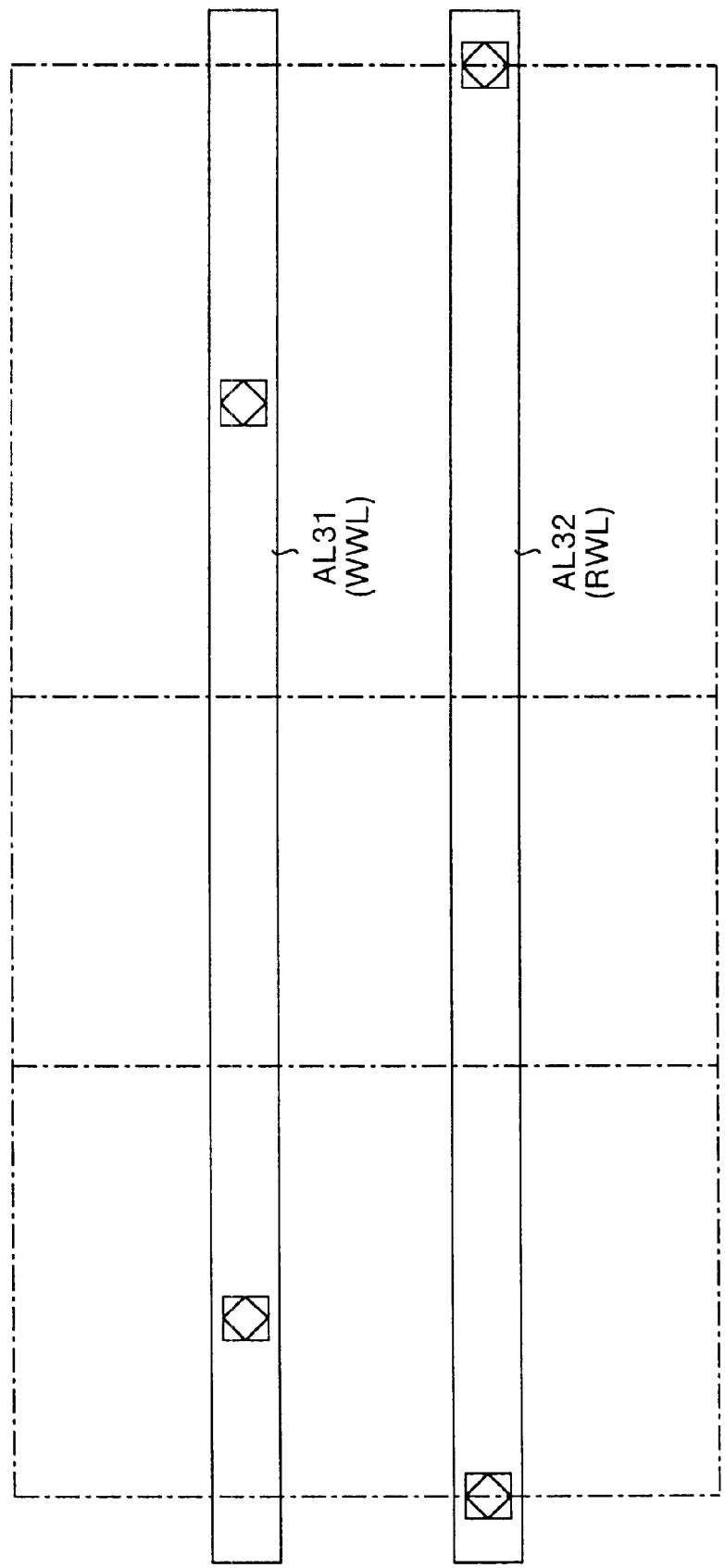
FIG. 20 is a diagram showing another example of the layout of the memory cell of the semiconductor memory device according to the fifth embodiment.
Figure 21:
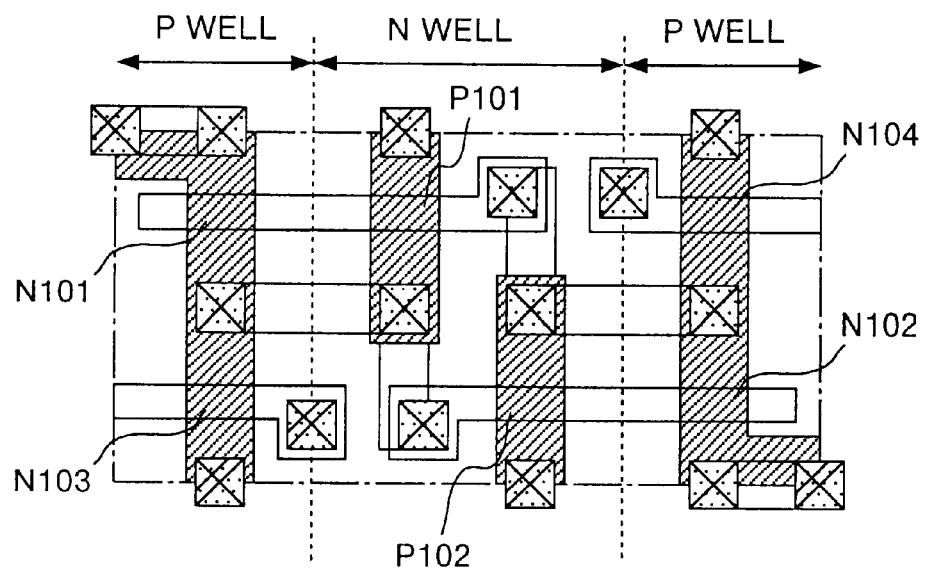
FIG. 21 is a layout diagram showing a diffusion area formed on the surface of a semiconductor substrate, a polycrystalline silicon film formed on the diffusion areas, and a ground including a first metal-wiring layer, according to a conventional semiconductor memory device.
Figure 22:
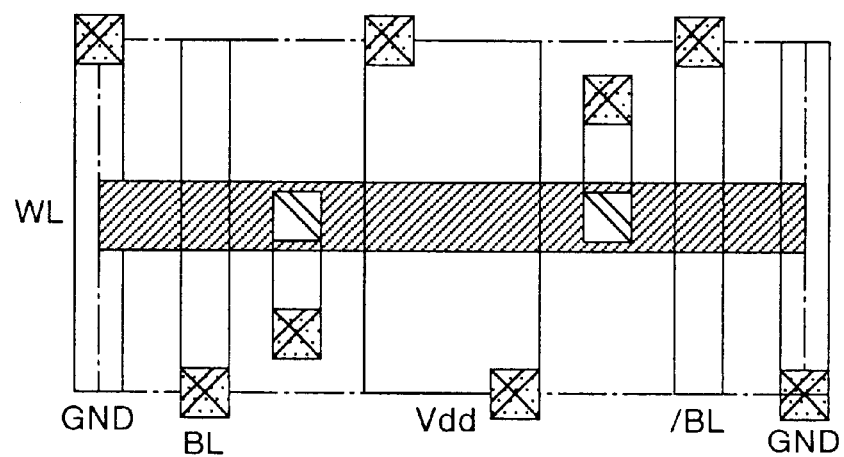
FIG. 22 is a layout diagram showing an upper ground including second and third metal-wiring layers formed on the upper layer, according to the conventional semiconductor memory device.
Figure 23:
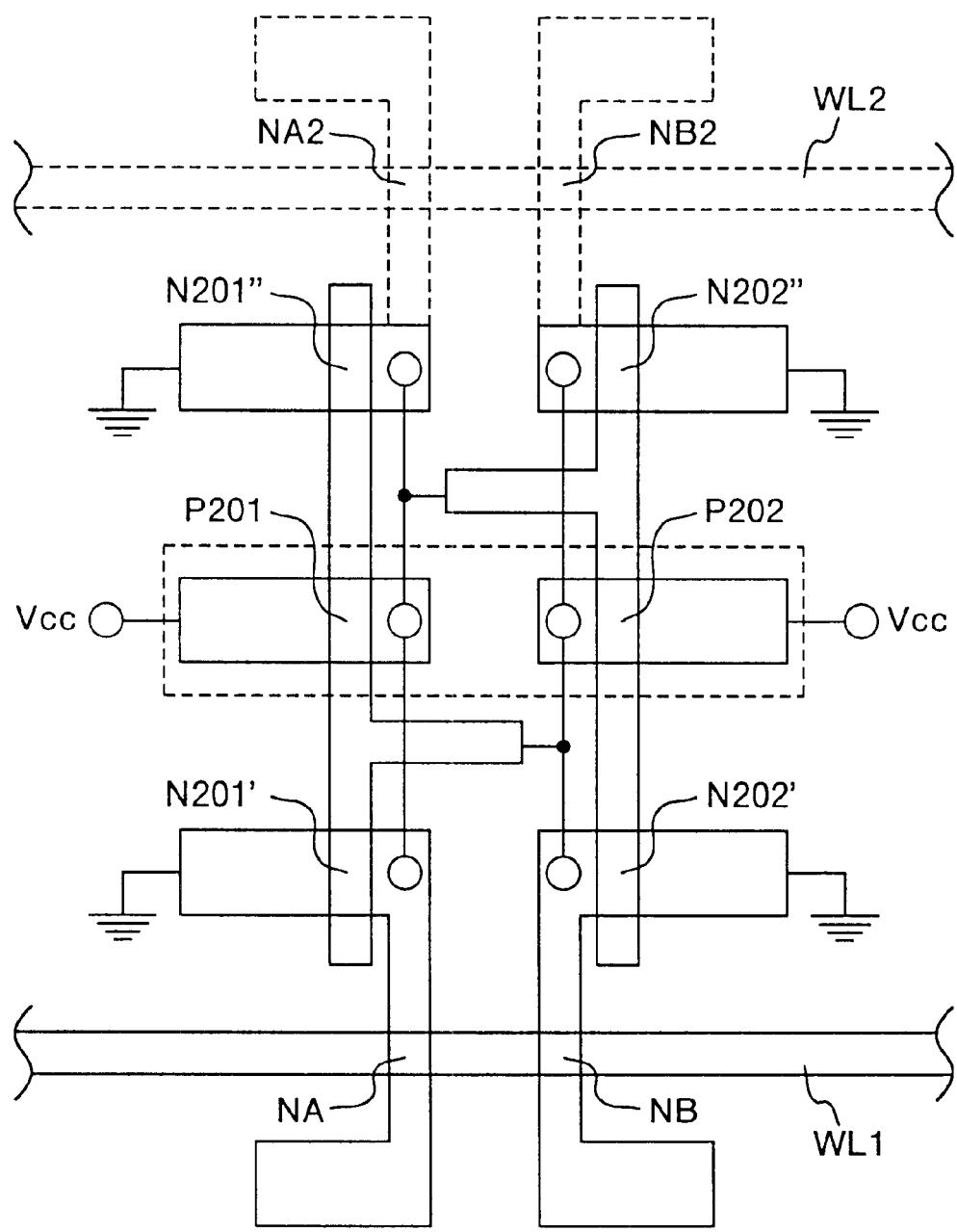
FIG. 23 is a layout diagram showing a conventional memory cell.

Therefore, layers positioned above the layers shown in FIG. 15 will be explained. FIGS. 19 and 20 are layout diagrams of the memory cell of the semiconductor memory device in the fifth embodiment. Particularly, FIG. 19 shows a layer including the second metal wiring layer corresponding to that shown FIG. 16. FIG. 20 shows a layer including the third metal wiring layer corresponding to that shown FIG. 17.

First, as one of layers shown in FIG. 19, there is formed a second metal-wiring layer AL21 for applying a power source potential VDD to the p⁺ diffusion area FL11 via the first metal-wiring layer AL15 shown in FIG. 15 and for applying a power source potential VDD to the p⁺ diffusion area FL14 via the first metal-wiring layer AL16. In other words, the second metal-wiring layer AL21 functions as a power source potential VDD line, and achieves a connection between the source of the P-channel type MOS transistor P1 and the power source and a connection between the source of the P-channel type MOS transistor P2 and the power source, in the equivalent circuit shown in FIG. 18.

Further, there are formed a second metal-wiring layer AL22 for applying a ground potential GND to the p⁺ diffusion areas FL21 and FL24 via a first metal wiring layer AL17 shown in FIG. 15, and a second metal-wiring layer AL23 for applying a ground potential GND to the p⁺ diffusion areas FL31 and FL34 respectively via a first metal wiring layer AL18 shown in FIG. 15. In other words, the second metal-wiring layers AL22 and AL23 function as a ground potential GND line respectively, and achieve a grounding of each source of the N-channel type MOS transistors N1, N2, N8 and N10 respectively, in the equivalent circuit shown in FIG. 18.

Further, as layers shown in FIG. 19, there are formed a second metal-wiring layer AL24 that is connected with the lower-layer p⁺ diffusion area FL23 and functions as a first positive-phase bit line WBL1, a second metal-wiring layer AL42 that is connected with the lower-layer p⁺ diffusion area FL26 and functions as a second negative-phase bit line RBL2, a second metal-wiring layer AL25 that is connected with the p⁺ diffusion area FL36 and functions as a negative-phase bit line WBL2, and a second metal-wiring layer AL26 that is connected with the p⁺ diffusion area FL33 and functions as a second positive-phase bit line RBL1, via the contact holes and the first via holes shown in FIG. 15 respectively.

In other words, these second metal-wiring layers AL24 to AL26 and AL42 achieve a connection between the other semiconductor terminal end (drain) of the N-channel type MOS transistor N3 and the first positive-phase bit line WBL1, a connection between the other semiconductor terminal end (drain) of the N-channel type MOS transistor N4 and the negative-phase bit line WBL2, a connection between the other semiconductor terminal end (drain) of the N-channel type MOS transistor N9 and the second positive-phase bit line RBL1, and a connection between the other semiconductor terminal end (drain) of the N-channel type MOS transistor N11 and the second negative-phase bit line RBL2, respectively, in the equivalent circuit shown in FIG. 18.

Particularly, it is possible to form the second metal-wiring layers AL24 to AL26 and AL42 in a straight-line shape respectively extending in a direction parallel with the first well boundary line. This means that it is possible to further reduce the length of each of the first positive-phase bit line WBL1, the negative-phase bit line WBL2, the second positive-phase bit line RBL1, and the second negative-phase bit line RBL2 within one memory cell.

Further, as layers shown in FIG. 19, there are formed a second metal-wiring layer AL41 for moving the connection point between the lower-layer first metal wiring layer AL13 and the upper layer, a second metal-wiring layer AL28 for moving the connection point between the lower-layer first metal wiring layer AL19 and the upper layer, and a second metal-wiring layer AL27 for moving the connection point between the lower-layer first metal wiring layer AL10 and the upper layer. Further, there is formed a second metal-wiring layer AL29 for connecting between the polysilicon wiring layer PL31 and the upper layer via the lower-layer first metal wiring layer AL14.

Next, layers positioned above the layers shown in FIG. 19 will be explained. FIG. 20 shows layers including third metal-wiring layers formed on the layers shown in FIG. 19. As one of layers shown in FIG. 20, there is formed a third metal-wiring layer AL31 for electrically connecting the polysilicon wiring layers PL21 and PL33 via the first metal wiring layer AL10 and the second metal wiring layer AL27 and also for functioning as a first word line WWL. In other words, the third metal-wiring layer AL31 achieves a connection between the gates of the N-channel type MOS transistors N3 and N4 and the first word line WWL, in the equivalent circuit shown in FIG. 18.

Further, there is formed a third metal-wiring layer AL32 for electrically connecting between the polysilicon wiring layers PL22 and PL31 via the first metal wiring layer AL14 and the second metal wiring layer AL29 and for functioning as a second word line RWL. In other words, the third metal-wiring layer AL32 achieves a connection between the gates of the N-channel type MOS transistor N9 and N11 and the second word line RWL, in the equivalent circuit shown in FIG. 18.

Particularly, as shown in FIG. 20, from the positional relationship between the second metal wiring layers AL27 and AL28, these metal wiring layers can be connected by a straight-line shaped metal wiring layer extending in a direction perpendicular to the first well boundary line. In other words, it is possible to form the third metal wiring layer AL31 shown in FIG. 20 in a straight-line shape extending in a direction perpendicular to the first well boundary line. This similarly applies to the third metal-wiring layer AL32. This means that it is possible to further reduce the length of each of the first word line WWL and the second word line RWL, within one memory cell.

As explained above, according to the semiconductor memory device of the fifth embodiment, it is also possible to obtain the effect of the third embodiment in the differential-reading type two-port SRAM cell that can execute a reading operation at a higher speed, as well.

As explained above, according to the present invention, the first, third and fifth N-channel type MOS transistors that are electrically connected to the positive-phase bit line and the second, fourth and sixth N-channel type MOS transistors that are connected to the negative-phase bit line are formed in the divided P-well areas respectively. Therefore, when these well areas are disposed in a direction perpendicular to the positive-phase and negative-phase bit lines respectively, it is possible to use a layout having a short length for the bit lines. As a result, there is an effect that it is possible to achieve a high-speed accessing.

Further, as the first and second P-well areas are formed on the two sides of the N-well area, it is possible to make uniform the distances of wiring connection between the N-channel type MOS transistors formed in the first and second P-well areas respectively and the P-channel type MOS transistors formed in the N-well area. As a result, there is an effect that it is possible to employ an optimum layout for a shortest wiring.

Further, the extension directions of the bit lines are parallel with the boundary lines between the first and second P-well areas and the N-well area respectively. Therefore, it is possible to provide a layout having each bit line formed in a shortest length by taking into consideration a reduction in the length of each word line.

Further, the extension direction of each word line is perpendicular to the boundary lines between the first and second P-well areas and the N-well area respectively. Therefore, it is possible to provide a layout having each word line formed in a shortest length by taking into consideration a reduction in the length of each bit line with priority.

Further, as the first P-channel type MOS transistor and the gate areas of the first, third and fourth N-channel type MOS transistors are formed to be positioned on the same straight line, it is possible to form wires for connecting between the gates in a straight-line shape. Further, as the second P-channel type MOS transistor and the gate areas of the second, fifth and sixth N-channel type MOS transistors are also formed to be positioned on the same straight line, it is possible to form wires for connecting between the gates in a straight-line shape. As a result, there is an effect that it is possible to obtain shorter wiring.

Further, as each source and each drain of the third and fifth N-channel type MOS transistors that function as an access gate are positioned on the same straight line, it is possible to reduce the disposition distance between the third and fifth N-channel type MOS transistors. Further, as each source and each drain of the fourth and sixth N-channel type MOS transistors are also positioned on the same straight line, it is possible to reduce the disposition distance between the fourth and sixth N-channel type MOS transistors. As a result, there is an effect that it is possible to improve the degree of integration of the memory cell.

Further, as the drain diffusion areas are formed in a common $n^+$ diffusion area for the third and fifth N-channel type MOS transistors and for the fourth and sixth N-channel type MOS transistors respectively, it is possible to reduce the size of the $n^+$ diffusion areas. As a result, there is an effect that it is possible to reduce a parasitic capacitance due to the $n^+$ diffusion area.

Further, the drain diffusion area of the first N-channel type MOS transistor and the drain diffusion areas of the third and fifth N-channel type MOS transistors are connected to each other by the upper-layer first metal-wiring layer, and the drain diffusion area of the second N-channel type MOS transistor and the drain diffusion areas of the fourth and sixth N-channel type MOS transistors are connected to each other by the upper-layer second metal-wiring layer. Therefore, it is possible to form the first and second metal-wiring layers in a straight-line shape according to the positions of the drain diffusion areas. As a result, there is an effect that it is possible to obtain shorter wiring.

Further, as the extension direction of the first and second metal-wiring layers is parallel with an extension direction of each word line, it is possible to optimize the length of the metal-wiring layers like the word lines.

Further, the extension lines of the bit lines, the power source line and the GND line are perpendicular to each word line. Therefore, it is possible to minimize the respective length of these lines. As a result, there is an effect that it is possible to achieve a high-speed accessing.

Further, as the drain diffusion areas are formed in a common $n^+$ diffusion area for the first, third and fifth N-channel type MOS transistors and for the second, fourth and sixth N-channel type MOS transistors respectively, it is possible to omit the metal-wiring layers between these drain diffusion areas.

Further, the first $n^+$ diffusion area and the drain diffusion area of the first P-channel type MOS transistor and the second $n^+$ diffusion area and the drain diffusion area of the second P-channel type MOS transistor are connected to each other by the upper-layer second metal-wiring layers respectively. Therefore, it is possible to form the metal-wiring layers in a straight-line shape according to the positions of the drain diffusion areas and the $n^+$ diffusion areas. As a result, there is an effect that it is possible to obtain shorter wiring.

According to another aspect of this invention, in a circuit that structures a dual port SRAM cell with fifth and sixth N-channel type MOS transistors formed as reading ports, first, third, and the fifth N-channel type MOS transistors electrically connected to a positive-phase bit line, and second and fourth N-channel type MOS transistors connected to a negative-phase bit line are formed in separated P-well areas, respectively. Therefore, the juxtaposing direction of these well areas in particular is made perpendicular to the direction of the positive-phase and negative-phase bit lines, which makes it possible to apply a layout with the decreased length of the bit lines. As a result, there is an effect that it is possible to achieve a high-speed accessing.

Further, in a circuit that structures a three port SRAM cell in which the fifth and sixth N-channel type MOS transistors are formed as first reading ports, and seventh and eighth N-channel type MOS transistors are formed as second reading ports, the first, third, and fifth N-channel type MOS transistors electrically connected to the positive-phase bit line, and the second, fourth, and seventh N-channel type MOS transistors connected to the negative-phase bit line are formed in the separated P-well areas, respectively. Therefore, the juxtaposing direction of these well areas in particular is made perpendicular to the direction of the positive-phase and negative-phase bit lines, which makes it possible to apply a layout with the decreased length of the bit lines. As a result, there is an effect that it is possible to achieve a high-speed accessing.

Further, in a circuit that structures a difference reading type of dual port SRAM cell for performing reading operation based on a potential difference between a second positive-phase bit line and a second negative-phase bit line, the first, third, and fifth N-channel type MOS transistors electrically connected to the positive-phase bit line, and the second, fourth, and seventh N-channel type MOS transistors connected to the negative-phase bit line are formed in the separated P-well areas, respectively. Therefore, the juxtaposing direction of these well areas in particular is made perpendicular to the direction of the positive-phase and negative-phase bit lines, which makes it possible to apply a layout with the decreased length of the bit lines. As a result, there is an effect that it is possible to achieve a high-speed accessing.

Further, as first and second P-well areas are disposed on both sides of an N-well area, the distances of connection wiring between the N-channel type MOS transistors formed in the first and second P-well areas respectively and the P-channel type MOS transistor formed in the N-well area can be made uniform. As a result, there is an effect that it is possible to employ an optimal layout with further shorter wiring.

Further, as the extension direction of the bit lines is parallel with each boundary line between the first and second P-well areas and the N-well area, it is possible to apply a layout with the minimized length of the bit lines when it is considered that the length of the word lines is also decreased.

Further, as the extension direction of the word lines is perpendicular to each boundary line between the first and second P-well areas and the N-well area, it is possible to apply a layout with the minimized length of the word lines when it is considered that the length of the bit lines should preferentially be decreased.

Further, the respective gate areas of a first P-channel type MOS transistor, and the first, fourth and sixth N-channel type MOS transistors are formed so as to position on the same straight line. Therefore, the wiring to connect between these gates is formed in a straight-line shape. Further, the respective gate areas of a second P-channel type MOS transistor, and the second, third and fifth N-channel type MOS transistors are formed so as to also position on the same straight line. Therefore, the wiring to connect between these gates is formed in a straight-line shape. As a result, there is an effect that it is possible to obtain shorter wiring.

Further, as the drain of the second N-channel type MOS transistor and the source of the fourth N-channel type MOS transistor are positioned on the same straight line, it is possible to reduce the space between these second and fourth N-channel type MOS transistors. Further, as the drain of the fifth N-channel type MOS transistor and the source of the sixth N-channel type MOS transistor are positioned on the same straight line, it is possible to reduce the space between these fifth and sixth N-channel type MOS transistors. As a result, there is an effect that it is possible to improve the scale of integration of memory cells.

Further, respective ones of the semiconductor terminals are formed in a common $n^+$ diffusion area for the first and third N-channel type MOS transistors and for the fifth and sixth N-channel type MOS transistors. Therefore, it is possible to reduce an entire $n^+$ diffusion area. As a result, there is an effect that it is possible to reduce parasitic capacitance due to the $n^+$ diffusion area.

Further, the second P-channel type MOS transistor, and the second and fifth N-channel type MOS transistors have their respective gate areas connected by a straight line-shaped common polysilicon wiring. Therefore, it is possible to reduce the space between these MOS transistors. As a result, there is an effect that it is possible to improve the scale of integration of the memory cells.

Further, the extension lines of the bit lines, a power source line, and a GND line respectively are perpendicular to each word line. Therefore, it is possible to minimize the length of these lines. As a result, there is an effect that it is possible to achieve a high-speed accessing.

Further, the respective gate areas of the first P-channel type MOS transistor, and the first, fourth, sixth and seventh N-channel type MOS transistors are formed so as to position on the same straight line. Therefore, it is possible to form the wiring to connect between these gates in a straight-line shape. Further, the respective gate areas of the second P-channel type MOS transistor, and the second, third, fifth and eighth N-channel type MOS transistors are formed so as to also position on the same straight line. Therefore, it is possible to form the wiring to connect between these gates in a straight-line shape. As a result, there is an effect that it is possible to obtain shorter wiring.

Further, as the drain of the second N-channel type MOS transistor and the source of the fourth N-channel type MOS transistor are positioned on the same straight line, it is possible to reduce the space between these second and fourth N-channel type MOS transistors. As the drain of the fifth N-channel type MOS transistor and the source of the sixth N-channel type MOS transistor are also positioned on the same straight line, it is possible to reduce the space between these fifth and sixth N-channel type MOS transistors. Further, as the drain of the seventh N-channel type MOS transistor and the source of the eighth N-channel type MOS transistor are positioned on the same straight line as well, it is possible to reduce the space between these seventh and eighth N-channel type MOS transistors. As a result, there is an effect that it is possible to improve the scale of integration of the memory cells.

Further, respective ones of the semiconductor terminals are formed in a common $n^+$ diffusion area for the first and third N-channel type MOS transistors, for the fifth and sixth N-channel type MOS transistors, and for the seventh and eighth N-channel type MOS transistors. Therefore, it is possible to reduce an entire $n^+$ diffusion area. As a result, there is an effect that it is possible to reduce parasitic capacitance due to the $n^+$ diffusion area.

Further, the second P-channel type MOS transistor, and the second and fifth N-channel type MOS transistors have their respective gate areas connected by a straight line-shaped common polysilicon wiring. Further, the first P-channel type MOS transistor, and the first and seventh N-channel type MOS transistors have their respective gate areas connected by a straight line-shaped common polysilicon wiring. Therefore, it is possible to reduce the space between these MOS transistors. As a result, there is an effect that it is possible to improve the scale of integration of the memory cells.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising:
    a semiconductor substrate;
    a first word line and a second word line;
    a first positive-phase bit line and a second positive-phase bit line;
    a first negative-phase bit line and a second negative-phase bit line;
    a first CMOS inverter having a first N-channel MOS transistor, a first P-channel MOS transistor, and input and output terminals;
    a second CMOS inverter having a second N-channel MOS transistor, a second P-channel MOS transistor, and input and output terminals, wherein said input terminal of said second CMOS inverter is connected to said output terminal of said first CMOS inverter as a first memory node, and said output terminal of said second CMOS inverter is connected to said input terminal of said first CMOS inverter as a second memory node;

a third N-channel MOS transistor having a gate that is connected to said first word line, having a drain that is connected to said first positive-phase bit line, and having a source that is connected to said first memory node;

a fourth N-channel MOS transistor having a gate that is connected to said first word line, having a drain that is connected to said first negative-phase bit line, and having a source that is connected to said second memory node;

a fifth N-channel MOS transistor having a gate that is connected to said second word line, having a drain that is connected to said second positive-phase bit line, and having a source that is connected to said first memory node; and a sixth N-channel MOS transistor having a gate that is connected to said second word line, having a drain that is connected to said second negative-phase bit line, and having a source that is connected to said second memory node, wherein said first and second P-channel MOS transistors are located in an N-well area of said semiconductor substrate, said first, third, and fifth N-channel MOS transistors are located in a first P-well area of said semiconductor substrate, and said second, fourth, and sixth N-channel MOS transistors are located in a second P-well area of said semiconductor substrate.

2. The semiconductor memory device according to claim 1, wherein said first and second P-well areas are located on two different sides of said N-well area.

3. The semiconductor memory device according to claim 1, wherein said first positive-phase bit line, said first negative-phase bit line, said second positive phase bit line, and said second negative-phase bit line extend along directions parallel to boundaries between said first P-well area and said N-well area, and between said second P-well area and said N-well area.

4. The semiconductor memory device according to claim 1, wherein boundaries between said first P-well area and said N-well area, and between said second P-well area and said N-well area, are perpendicular to said first and second word lines.

5. The semiconductor memory device according to claim 1, wherein said first P-channel MOS transistor and said first, third, and fourth N-channel MOS transistors have respective gate areas parallel to said first word line and positioned on a first straight line, and said second P-channel MOS transistor and said second, fifth, and sixth N-channel MOS transistors have respective gate areas parallel to said second word line and positioned on a second straight line.

6. The semiconductor memory device according to claim 1, wherein said third and fifth N-channel MOS transistors have respective source diffusion areas and drain diffusion areas parallel to said first and said second positive-phase bit lines and positioned on a first straight line, and said fourth and sixth N-channel MOS transistors have respective source diffusion areas and drain diffusion areas parallel to said first and said second negative-phase bit lines and positioned on a second straight line.

7. The semiconductor memory device according to claim 1, wherein said third and fifth N-channel MOS transistors have respective drain diffusion areas in a first n$^+$ diffusion area of said semiconductor substrate, and said fourth and sixth N-channel MOS transistors have respective drain diffusion areas in a second n$^+$ diffusion area of said semiconductor substrate.

8. The semiconductor memory device according to claim 1, wherein said first N-channel MOS transistor has a drain diffusion area and said third and fifth N-channel MOS transistors have drain diffusion areas, and including an upper-layer first metal-wiring layer connecting the drain diffusion areas of said first, third, and fifth N-channel MOS transistors via contact holes, and said second N-channel MOS transistor has a drain diffusion area and said fourth and sixth N-channel MOS transistors have drain diffusion areas, and including an upper-layer second metal-wiring layer connecting the drain diffusion areas of said second, fourth, and sixth N-channel MOS transistors together via contact holes.

9. The semiconductor memory device according to claim 8, wherein said upper layer first and second metal-wiring layers are parallel to said first and second word lines.

10. The semiconductor memory device according to claim 1, wherein said first and second positive-phase bit lines, said first and second negative-phase bit lines, a power source line, and a GND line are perpendicular to said first and second word lines.

11. The semiconductor memory device according to claim 1, wherein said first, third, and fifth N-channel MOS transistors have drain diffusion areas located in a first n$^+$ diffusion area of said semiconductor substrate, and said second, fourth, and sixth N-channel MOS transistors have drain diffusion areas located in a second n$^+$ diffusion area of said semiconductor substrate.

12. The semiconductor memory device according to claim 11 including upper-layer first and second metal-wiring layers, wherein said first P-channel MOS transistor has a drain diffusion area connected to said first n$^+$ diffusion area by said upper-layer first metal-wiring layer via contact holes, and said second P-channel MOS transistor has a drain diffusion area connected to said second n$^+$ diffusion area by said upper-layer second metal-wiring layer via contact holes.

13. A semiconductor memory device comprising:

a semiconductor substrate;

a first word line;

a second word line;

a first positive-phase bit line;

a first negative-phase bit line;

a second positive-phase bit line;

a first CMOS inverter including a first N-channel MOS transistor, a first P-channel MOS transistor, and input and output terminals;

a second CMOS inverter including a second N-channel MOS transistor, a second P-channel MOS transistor, and an input terminal connected to said output terminal of said first CMOS inverter as a first memory node, an output terminal connected to an input terminal of said first CMOS inverter as a second memory node;

a third N-channel MOS transistor that has a gate connected to said first word line, a drain connected to said first positive-phase bit line, and a source connected to said first memory node;

a fourth N-channel MOS transistor that has a gate connected to said first word line, a drain connected to said first negative-phase bit line, and a source connected to said second memory node;

a fifth N-channel MOS transistor that has a gate connected to said first memory node; and a sixth N-channel MOS transistor that has a gate connected to said second word line, a drain connected to said second positive-phase bit line, and a source connected to a drain of said fifth N-channel MOS transistor, wherein said first and second P-channel MOS transistors are located in an N-well area of said semiconductor substrate, said first and third N-channel MOS transistors are located in a first P-well area of said semiconductor substrate, and said second, fourth, fifth, and sixth N-channel MOS transistors are located in a second P-well area of said semiconductor substrate.

14. The semiconductor memory device according to claim 13, further comprising:

a third word line;

a second negative-phase bit line;

a seventh N-channel MOS transistor that has a gate connected to said second memory node; and an eighth N-channel MOS transistor that has a gate connected to said third word line, a drain connected to said second negative-phase bit line, and a source connected to a drain of said seventh N-channel MOS transistor, wherein said seventh and eighth N-channel MOS transistors are located in said first P-well area.

15. The semiconductor memory device according to claim 14, wherein said second and third word lines are a common word line.

16. The semiconductor memory device according to claim 13, wherein said first and second P-well areas are located at different sides of said N-well area.

17. The semiconductor memory device according to claim 13, wherein respective directions of said first positive-phase bit line, said first negative-phase bit line, and said second positive-phase bit line are parallel to a boundary line between said first and second P-well areas and said N-well area.

18. The semiconductor memory device according to claim 13, wherein a boundary line between said first and second P-well areas and said N-well area is perpendicular to said first and second word lines.

19. The semiconductor memory device according to claim 13, wherein said first P-channel MOS transistor, and said first, fourth, and sixth N-channel MOS transistors have respective gate areas positioned on a first straight line, and parallel to said first word line, and said second P-channel MOS transistor, and said second, third, and fifth N-channel MOS transistors have respective gate areas positioned on a second straight line, and parallel to said second word line.

20. The semiconductor memory device according to claim 13, wherein said first N-channel MOS transistor has a drain diffusion area and said third N-channel MOS transistor has a source diffusion area that are commonly positioned on a first straight line, and parallel to said first positive-phase bit line, said second N-channel MOS transistor has a drain diffusion area and said fourth N-channel MOS transistor has a source diffusion area that are commonly positioned on a second straight line, and parallel to said first negative-phase bit line, and said fifth N-channel MOS transistor has a drain diffusion area and said sixth N-channel MOS transistor has a source diffusion area that are commonly positioned on a third straight line, and parallel to said second positive-phase bit line.

21. The semiconductor memory device according to claim 13, wherein said first N-channel MOS transistor has a drain diffusion area and said third N-channel MOS transistor has a source diffusion area that are located commonly in a first $n^+$ diffusion area of said semiconductor substrate, said second N-channel MOS transistor has a drain diffusion area and said fourth N-channel MOS transistor has a source diffusion area that are located commonly in a second $n^+$ diffusion area of said semiconductor substrate, and said fifth N-channel MOS transistor has a drain diffusion area and said sixth N-channel MOS transistor has a source diffusion area that are located commonly in a third $n^+$ diffusion area of said semiconductor substrate.

22. The semiconductor memory device according to claim 13, wherein said second P-channel MOS transistor, and said second and fifth N-channel MOS transistors have respective gate areas connected by common polysilicon wiring lying along a straight line.

23. The semiconductor memory device according to claim 13, wherein said first and second positive-phase bit lines, said first negative-phase bit line, a power source line, and a GND line are perpendicular to said first and second word lines.

24. The semiconductor memory device according to claim 14, wherein said first P-channel MOS transistor, and said first, fourth, sixth, and seventh N-channel MOS transistors have respective gate areas parallel to said first word line and positioned on a first straight line, and said second P-channel MOS transistor, and said second, third, fifth, and eighth N-channel MOS transistors have respective gate areas parallel to said second word line and positioned on a second straight line.

25. The semiconductor memory device according to claim 14, wherein said first N-channel MOS transistor has a drain diffusion area and said third N-channel MOS transistor has a source diffusion area that are parallel to said first positive-phase bit line, and positioned on a first straight line, said second N-channel MOS transistor has a drain diffusion area and said fourth N-channel MOS transistor has a source diffusion area that are parallel to said first negative-phase bit line, and positioned on a second straight line, said fifth N-channel MOS transistor has a drain diffusion area and said sixth N-channel MOS transistor has a source diffusion area that are parallel to said second positive-phase bit line, and positioned on a third straight line, and said seventh N-channel MOS transistor has a drain diffusion area and said eighth N-channel MOS transistor has a source diffusion area that are parallel to said second negative-phase bit line and positioned on a fourth straight line.

26. The semiconductor memory device according to claim 14, wherein said first N-channel MOS transistor has a drain diffusion area and said third N-channel MOS transistor has a source diffusion area that are located commonly in a first n⁺ diffusion area of said semiconductor substrate, said second N-channel MOS transistor has a drain diffusion area and said fourth N-channel MOS transistor has a source diffusion area that are located commonly in a second n⁺ diffusion area of said semiconductor substrate, said fifth N-channel MOS transistor has a drain diffusion area and said sixth N-channel MOS transistor has a source diffusion area that are located commonly in a third n⁺ diffusion area of said semiconductor substrate, and said seventh N-channel MOS transistor has a drain diffusion area and said eighth N-channel MOS transistor has a source diffusion area that are located commonly in a fourth n⁺ diffusion area of said semiconductor substrate.

27. The semiconductor memory device according to claim 14, wherein said second P-channel MOS transistor, and said second and fifth N-channel MOS transistors have respective gate areas connected by common first polysilicon wiring lying along a first straight line, and said first P-channel MOS transistor, and said first and seventh N-channel MOS transistors have respective gate areas connected by common second polysilicon wiring lying along a second straight line.

* * * * *